(12) United States Patent
Morokuma et al.

(10) Patent No.: US 9,396,871 B2
(45) Date of Patent: Jul. 19, 2016

(54) SIGNAL TRANSMITTING CIRCUIT

(71) Applicants: Kenichi Morokuma, Chiyoda-ku (JP); Jun Tomisawa, Chiyoda-ku (JP); Kazuyasu Nishikawa, Chiyoda-ku (JP)

(72) Inventors: Kenichi Morokuma, Chiyoda-ku (JP); Jun Tomisawa, Chiyoda-ku (JP); Kazuyasu Nishikawa, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/431,359

(22) PCT Filed: Dec. 4, 2012

(86) PCT No.: PCT/JP2012/081378
§ 371 (c)(1),
(2) Date: Mar. 26, 2015

(87) PCT Pub. No.: WO2014/087481
PCT Pub. Date: Jun. 12, 2014

(65) Prior Publication Data
US 2015/0248966 A1    Sep. 3, 2015

(51) Int. Cl.
*H04B 5/00* (2006.01)
*H01F 38/14* (2006.01)
(Continued)

(52) U.S. Cl.
CPC .............. *H01F 38/14* (2013.01); *H03K 3/0377* (2013.01); *H03K 5/1534* (2013.01); *H03K 5/26* (2013.01);
(Continued)

(58) Field of Classification Search
CPC ..... H03K 5/1534; H03K 3/0377; H03K 5/26; H04L 25/0268; H01F 38/14; H04B 5/0093
USPC ........................................................ 375/259
See application file for complete search history.

(56) References Cited

U.S. PATENT DOCUMENTS 4,228,493 A * 10/1980 de Sartre ............... H02M 3/335
                                                363/147
5,740,131 A *  4/1998 Bernasconi ............ G04C 10/00
                                                368/148
(Continued)

FOREIGN PATENT DOCUMENTS

JP         5-175818 A      7/1993
JP      2010-056593 A      3/2010
(Continued)

OTHER PUBLICATIONS

D. Mizoguchi et al, "A 1.2 Gb/s/pin Wireless Superconnect based on Inductive Inter-chip Signaling (IIS),"IEEE International Solid-State Circuits Conference (ISSCC'04), Dig. Tech. Papers, pp. 142-143, 517, Feb. 2004.*

(Continued)

*Primary Examiner* — Daniel Washburn
*Assistant Examiner* — Berhanu Tadese
(74) *Attorney, Agent, or Firm* — Oblon, McClelland, Maier & Neustadt, L.L.P

(57) ABSTRACT

A transmitter circuit feeds to a transmitter coil, every time transmission data changes in logical value, a current signal in pulse form having a positive or negative polarity that is alternately inverted in response to each change in logical value; and a receiver circuit inputs induction voltage signals each being double pulses having both positive and negative polarities, which have been induced in a receiver coil by the current signal fed to the transmitter coil, to demodulate the transmission data. The receiver circuit includes: an amplifier that amplifies the induction voltage signals of double pulses induced in the receiver coil; and a signal generating unit that, when detecting first single pulses in the induction voltage signals of double pulses amplified by the amplifier, sets up an insensitive period for second single pulses therein, to generate an output signal corresponding to the transmission data, based solely on the first single pulses.

15 Claims, 12 Drawing Sheets

(51) Int. Cl.
  *H03K 5/1534* (2006.01)
  *H04L 25/02* (2006.01)
  *H03K 3/037* (2006.01)
  *H03K 5/26* (2006.01)

(52) U.S. Cl.
  CPC ............ *H04B 5/0031* (2013.01); *H04B 5/0093* (2013.01); *H04L 25/0268* (2013.01); *H01F 2038/143* (2013.01)

(56) References Cited

U.S. PATENT DOCUMENTS

| | | | | |
|---|---|---|---|---|
| 8,502,584 | B1* | 8/2013 | Dong | H04B 3/50 307/109 |
| 2009/0013116 | A1* | 1/2009 | Svanell | H04L 25/493 710/118 |
| 2009/0196312 | A1* | 8/2009 | Kuroda | H04J 3/047 370/503 |
| 2009/0233546 | A1* | 9/2009 | Sasaki | H04B 5/02 455/41.1 |
| 2009/0251129 | A1* | 10/2009 | Todorokihara | G01R 23/10 324/76.39 |
| 2011/0260786 | A1* | 10/2011 | Kuroda | G06K 7/10178 327/594 |
| 2011/0291702 | A1* | 12/2011 | Kaeriyama | H04L 7/0008 326/62 |
| 2012/0007438 | A1* | 1/2012 | Kuroda | H04L 25/0266 307/104 |
| 2015/0248966 | A1* | 9/2015 | Morokuma | H03K 5/1534 375/259 |

FOREIGN PATENT DOCUMENTS

| | | |
|---|---|---|
| JP | 2011/211563 A | 10/2011 |
| WO | 2007/029435 A1 | 3/2007 |
| WO | 2010/023825 A1 | 3/2010 |
| WO | 2010/047187 A1 | 4/2010 |
| WO | 2010/089974 A1 | 8/2010 |

OTHER PUBLICATIONS

International Search Report issued Mar. 12, 2013 in PCT/JP2012/081378 filed Dec. 4, 2012.

* cited by examiner

SIGNAL TRANSMITTING CIRCUIT

TECHNICAL FIELD

The present invention relates to a signal transmitting circuit that transmits transmission data through a transmitter coil and a receiver coil.

BACKGROUND ART

Generally, in power devices, in order to drive a three-phase AC motor and the like, inverters that convert a voltage from DC to AC are used. In the inverters, it is required to electrically insulate between a high voltage applied to the AC motor and a control unit, so that photo couplers have been ever used as insulation elements. However, in recent years, with the progress in downsizing and thinning of transformers, the photo couplers are substituted with pulse transformers and/or insulation elements using capacitors, that are superior to the photo couplers in reliability, power consumption, integration degree, transfer speed, etc. Meanwhile, for example, signal transmitting circuits that transmit transmission data through the insulation elements are used with the three-phase AC motors and the like, and thus they are required to suppress their erroneous outputs due to noise from the motors and the like.

Meanwhile, for example, in Japanese Patent Application Laid-open No. 2010-56593 (hereinafter, referred to as Patent Document 1), there is disclosed a low-power and fast transmission/reception technology of asynchronous induction coupling type in which, in response to each level change at the rising and falling times of transmission data, a transmitter feeds a positive or negative unipolar current signal in pulse form to a transmitter coil, and in association therewith, an induction voltage signal of a pair of consecutive before-after pulses (hereinafter, referred to as double pulses) having both positive and negative polarities is produced in an inductively-coupled receiver coil whereby the transmission data can be demodulated by receiving the induction voltage signal asynchronously.

According to the technology in Patent Document 1, the induction voltage signal of double pulses induced in the receiver coil is detected by a hysteresis comparator, and every time of that detection, the positive or negative unipolar pulse is outputted followed by this pulse output being inputted to a D flip-flop to thereby restore the transmission data; or instead, with respect to induction voltage signals of respective the first and the second pulses (hereinafter, each referred to as a single pulse) in the double pulses induced in the receiver coil, the first single pulse is not detected but the second single pulse is detected by a hysteresis comparator and is then inverted, to thereby restore the transmission data.

CITATION LIST

Patent Document

Patent Document 1: Japanese Patent Application Laid-open No. 2010-56593

SUMMARY OF THE INVENTION

Problems to be Solved by the Invention

However, in the conventional technology disclosed in Patent Document 1, as in the former case, when the transmission data is demodulated by inputting to the D flip-flop, the output of the positive or negative unipolar pulse obtained by detecting using the hysteresis comparator, the induction voltage signal of double pulses induced in the receiver coil, since the D flip-flop is required, there is a drawback that not only the mounting area increases but also an extra cost is incurred.

Further, as in the latter case, when the transmission data is demodulated not by detecting the first single pulse in the induction voltage signal of double pulses induced in the receiver coil, but by detecting the second single pulse using the hysteresis comparator followed by inverting that pulse, a delay time corresponding to a time interval between the first single pulse and the second single pulse, occurs between the original transmission data and the restored transmission data. When such a superfluous delay time occurs, there arises a drawback that a voltage conversion cannot be executed smoothly at the time of performing an inverter control, for example.

This invention has been made in view of the above problems, and an object thereof is to provide a signal transmitting circuit that suppresses occurrence of a superfluous delay time and prevents an erroneous operation due to noise, in the case where, in response to each level change at the rising and falling times of the transmission data, a positive or negative unipolar current signal in pulse form is fed to the transmitter coil, and in association therewith, the induction voltage signal of double pulses is produced in the inductively-coupled receiver coil whereby the transmission data is demodulated based on the induction voltage signal.

Means for Solving the Problems

A signal transmitting circuit of this invention serves to transmit each transmission data through a transmitter coil and a receiver coil, and comprises: a transmitter circuit that feeds to the transmitter coil, every time the transmission data changes in logical value, a current signal in pulse form having a positive or negative polarity that is alternately inverted in response to each change in logical value; and a receiver circuit that inputs induction voltage signals each being a pair of consecutive before-after double pulses having both positive and negative polarities, which have been induced in the receiver coil by the current signal fed to the transmitter coil, to thereby demodulate the transmission data; wherein the receiver circuit comprises: an amplifier that amplifies the induction voltage signals of double pulses induced in the receiver coil; and a signal generating unit that, when detecting first single pulses in the induction voltage signals of double pulses amplified by the amplifier, sets up in response to that detection, an insensitive period for second single pulses therein, to thereby generate an output signal corresponding to the transmission data, solely on the basis of the first single pulses.

Effect of the Invention

According to the signal transmitting circuit of the invention, by the transmitter circuit, every time the data inputted thereto changes in logical value, the current signal in pulse form having a positive or negative polarity that is alternately inverted in response to each change in logical value, is fed to the transmitter coil. In the receiver circuit, the induction voltage signals of double pulses induced in the receiver coil by the current signal fed to the transmitter coil is amplified by the amplifier unit. Then, in the signal generating unit, upon detection of the first single pulses in the induction voltage signals of double pulses having been amplified, in response to that detection, the insensitive period for the second single pulses is set up, to thereby generate the output signal corresponding to the transmission data, solely on the basis of the first single pulses. Thus, there is no case where a delay corresponding to a period between the first single pulse and the second single pulse occurs between the input signal inputted to the transmitter circuit and the output signal demodulated by the receiver circuit as in the conventional case. As a result, a voltage conversion can be executed smoothly even at the time of performing an inverter control, for example.

MODES FOR CARRYING OUT THE INVENTION

Figure 1:
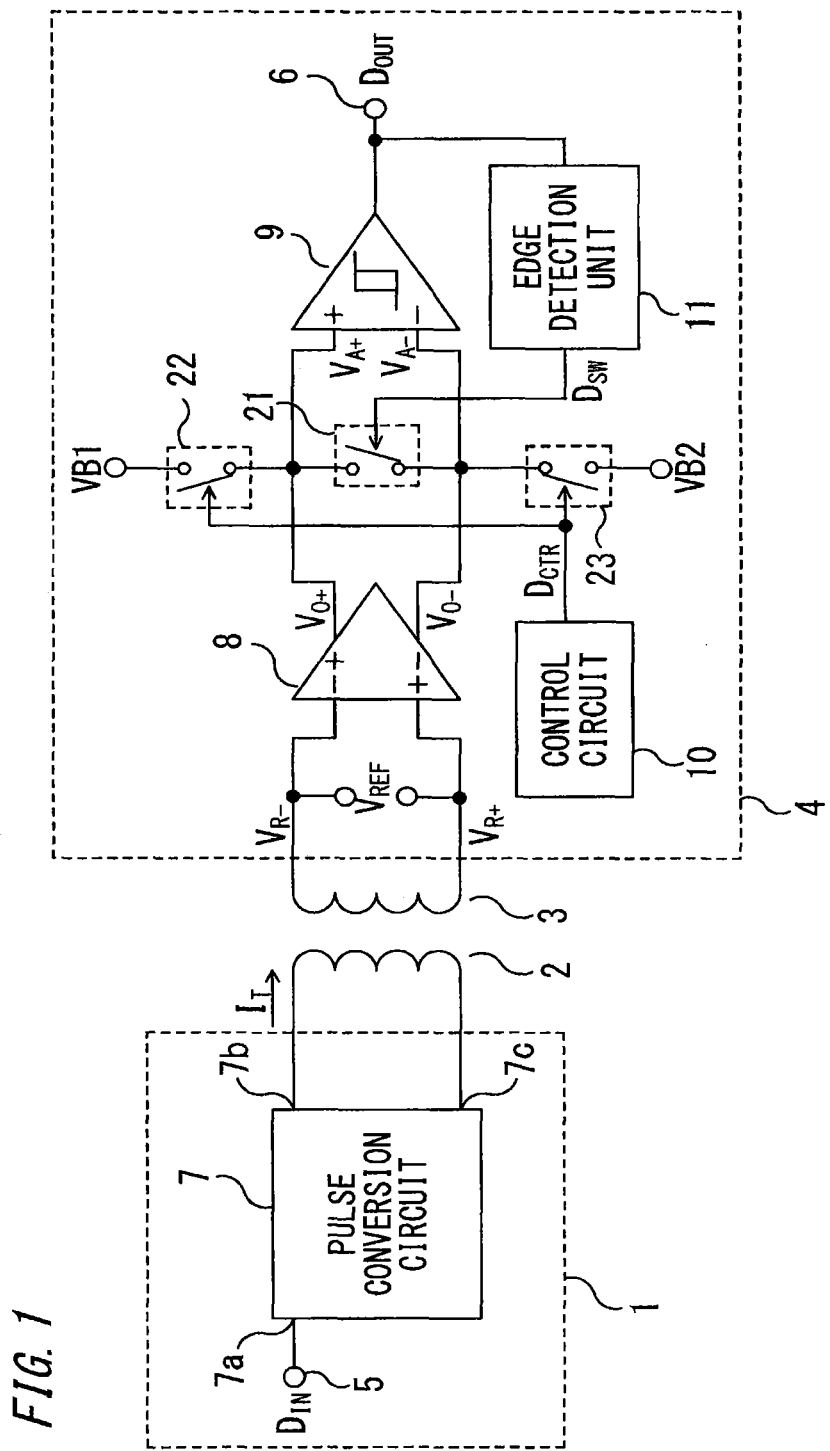
FIG. 1 is a circuit diagram showing a configuration of a signal transmitting circuit according to Embodiment 1 of the invention.

Hereinafter, embodiments of the invention will be described in detail with reference to the drawings. Note that in the following respective embodiments, the same reference numerals are given for the similar configuration elements. Further, the following circuits are each an example, so that the invention is not limited only to such configurations.

Embodiment 1

FIG. 1 is a circuit diagram showing a configuration of a signal transmitting circuit according to Embodiment 1 of the invention.

The signal transmitting circuit of Embodiment 1 includes a transmitter circuit 1, a transmitter coil 2, a receiver coil 3 and a receiver circuit 4.

The transmitter circuit 1 imports transmission data as an input signal $D_{IN}$, and every time the input signal $D_{IN}$ changes in logical value, feeds to the transmitter coil 2, a current signal $I_T$ in pulse form (hereinafter, referred to as a pulse current signal) having a positive or negative polarity that is alternately inverted in response to each change in logical value. Meanwhile, the receiver circuit 4 detects each first single pulse in induction voltage signals $V_R+$, $V_R-$ of double pulses having both positive and negative polarities which have been induced in the inductively-coupled receiver coil 3 by the pulse current signal $I_T$ of the transmitter coil 2. Then, in response to the detection of the first single pulses, the receiver circuit 4 sets up an insensitive period for second single pulses so as not to detect the second single pulses, to thereby generate an output signal $D_{OUT}$ resulting from demodulation of the input signal $D_{IN}$, solely on the basis of the first single pulses.

Here, the transmitter circuit 1 is provided with a pulse conversion circuit 7. The pulse conversion circuit 7 has an input terminal 7a to which connected is an input terminal 5 where the input signal $D_{IN}$ given as transmission data is inputted. Further, one-side end of the transmitter coil 2 is connected to one output terminal 7b of the pulse conversion circuit 7, and the other-side end of the transmitter coil 2 is connected to the other output terminal 7c.

The receiver circuit 4 includes an output terminal 6 where the output signal $D_{OUT}$ resulting from demodulation of the input signal $D_{IN}$ is outputted, an amplifier 8, a hysteresis comparator 9, a control circuit 10, an edge detection unit 11, a first switch 21, a second switch 22, a third switch 23, a first reference potential VB1, a second reference potential VB2 and a reference potential $V_{REF}$.

The amplifier 8 serves to amplify the induction voltage signals $V_R+$, $V_R-$ of double pulses induced in the receiver coil 3, and its respective two input terminals are individually connected to respective terminals of the receiver coil 3. Further, the amplifier 8 has a plus-side output terminal that is connected to a plus-side input terminal of the hysteresis comparator 9, and a minus-side output terminal that is connected to a minus-side input terminal of the hysteresis comparator 9.

The hysteresis comparator 9 inputs output signals $V_O+$ and $V_O-$ resulting from amplification of the induction voltage signals $V_R+$, $V_R-$ by the amplifier 8 and outputted from the plus-side and minus-side output terminals. The hysteresis comparator 9 has a hysteresis characteristic that, when the difference between the output signals $V_O+$, $V_O-$ of the amplifier 8 is a specified level or more, causes a level inversion and retains a constant output. The plus-side input terminal of the hysteresis comparator 9 is, in addition to being connected to the plus-side output terminal of the amplifier 8, connected to one-side end of the first switch 21, and the minus-side input terminal thereof is, in addition to being connected to the minus-side output terminal of the amplifier 8, connected to the other-side end of the first switch 21. Further, a single output terminal of the hysteresis comparator 9 is provided as the output terminal 6 where the output signal $D_{OUT}$ resulting from demodulation of the input signal $D_{IN}$ is outputted.

The control circuit 10 outputs a control signal $D_{CTR}$ for a specified period T0 in response to the time of power turn-on, reset operation or the like, and turns ON or OFF the second switch 22 and the third switch 23 using the control signal $D_{CTR}$. In this case, the output period T0 of the control signal $D_{CTR}$ from the control circuit 10 is pre-set by having incorporated an unshown timer circuit, etc. in the control circuit 10.

The edge detection unit 11 has an input terminal that is connected to the output terminal 6 of the above-described hysteresis comparator 9. The edge detection unit 11 detects both rising and falling edge components of the output signal $D_{OUT}$ of the hysteresis comparator 9, and generates in response to that edge detection, an edge detection signal $D_{SW}$ for a specified period T2 to thereby turn ON or OFF the first switch 21. In this case, the output period T2 of the edge detection signal $D_{SW}$ is pre-set by having incorporated an unshown one-shot multivibrator circuit, etc. in the edge detection unit 11. The output period T2 of the edge detection signal $D_{SW}$ is provided as the insensitive period for the second single pulses in the induction voltage signals $V_R+$, $V_R-$ of double pulses.

The first switch 21 has normally-OFF characteristic. One-side end of the first switch 21 is connected to the plus-side input terminal of the hysteresis comparator 9 and the other-side end is connected to the minus-side input terminal of the hysteresis comparator 9. The first switch 21 turns ON or OFF depending on the polarity of the edge detection signal $D_{SW}$ from the edge detection unit 11.

The second switch 22 has normally-OFF characteristic. One-side end of the second switch 22 is connected to the first reference potential VB1 and the other-side end is connected to the plus-side input terminal of the hysteresis comparator 9. The second switch 22 turns ON or OFF depending on the polarity of the control signal $D_{CTR}$ of the control circuit 10.

The third switch 23 has normally-OFF characteristic. One-side end of the third switch 23 is connected to the second reference potential VB2 and the other-side end is connected to the minus-side input terminal of the hysteresis comparator 9. The third switch 23 turns ON or OFF depending on the polarity of the control signal $D_{CTR}$ of the control circuit 10.

Figure 2:
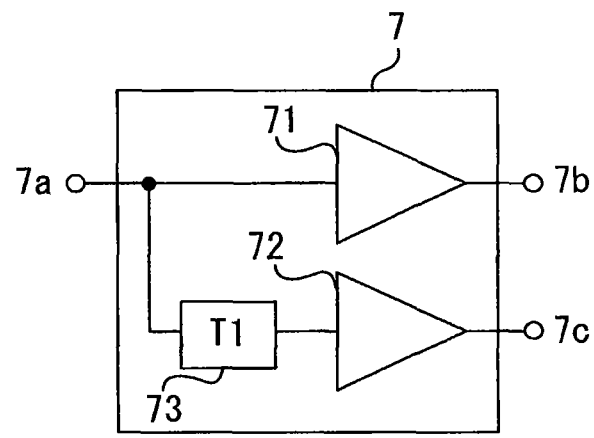
FIG. 2 is a circuit diagram showing a configuration of a pulse conversion circuit in the signal transmitting circuit according to Embodiment 1 of the invention.
Figure 3:
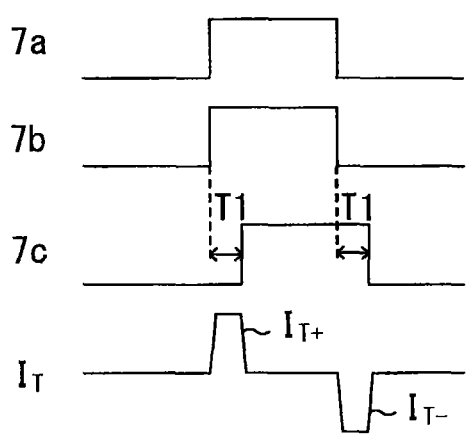
FIG. 3 is an operation waveform chart of the pulse conversion circuit according to Embodiment 1 of the invention.

FIG. 2 is a circuit diagram showing a configuration of the pulse conversion circuit 7, and FIG. 3 is its operation waveform chart.

The pulse conversion circuit 7 in FIG. 2 includes two buffer circuits 71, 72 and one delay circuit 73.

One buffer circuit 71 has an input portion that is connected to the input terminal 7a of the pulse conversion circuit 7, and an output portion that is connected to the output terminal 7b connected to the one-side end of the transmitter coil 2. The other buffer circuit 72 has an input portion that is connected to the input terminal 7a through the delay circuit 73, and an output portion that is connected to the output terminal 7b connected to the other-side end of the transmitter coil 2. The delay time between an input signal and an output signal of the delay circuit 73 is herein set to a period T1.

As shown in FIG. 3, in response to level changes from Low to High and High to Low of the input signal $D_{IN}$ applied to the input terminal 7a of the pulse conversion circuit 7, a signal with the same level changes is outputted from the one output terminal 7b provided through the buffer circuit 71. Also, from the other output terminal 7c provided through the buffer circuit 72, a signal with the same level changes is outputted after being delayed by the period T1 in the delay circuit 73.

Accordingly, in the transmitter coil 2 connected to both the output terminals 7b, 7c of the pulse conversion circuit 7, a positive pulse current signal $I_T+$ flows for the period T1 when the input signal $D_{IN}$ applied to the input terminal 7a of the pulse conversion circuit 7 changes from Low to High, and a negative pulse current signal $I_T-$ flows for the period T1 when the input signal $D_{IN}$ applied to the input terminal 7a of the pulse conversion circuit 7 changes from High to Low.

Figure 4:
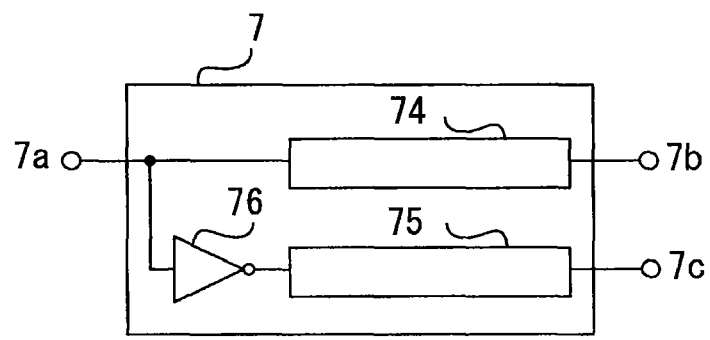
FIG. 4 is a circuit diagram showing another configuration of the pulse conversion circuit in the signal transmitting circuit according to Embodiment 1 of the invention.
Figure 5:
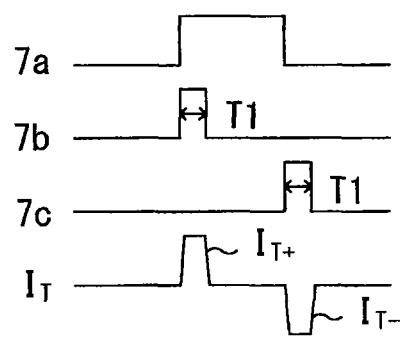
FIG. 5 is an operation waveform chart of the pulse conversion circuit according to Embodiment 1 of the invention.

FIG. 4 is a circuit diagram showing another configuration of the pulse conversion circuit 7, and FIG. 5 is its operation waveform chart.

The pulse conversion circuit 7 in FIG. 4 includes two rising-edge detection units 74, 75 and an inverter 76.

One rising-edge detection unit 74 has an input portion that is connected to the input terminal 7a of the pulse conversion circuit 7, and an output portion that is connected to the output terminal 7b connected to the one-side end of the transmitter coil 2. The other rising-edge detection unit 75 has an input portion that is connected to the input terminal 7a through the inverter 76, and an output portion that is connected to the output terminal 7c connected to the other-side end of the transmitter coil 2. In this case, the output period of edge detection signal from each of the edge detection units 74, 75 is herein set to the period T1, by having incorporated an unshown one-shot multivibrator circuit, etc. in each of the edge detection units 74, 75.

As shown in FIG. 5, when the input signal $D_{IN}$ applied to the input terminal 7a of the pulse conversion circuit 7 changes from Low to High, this rising edge is detected by the rising-edge detection unit 74, so that a positive edge detection signal is outputted for the period T1 from the output terminal 7b. Meanwhile, when the input signal $D_{IN}$ applied to the input terminal 7a of the pulse conversion circuit 7 changes from High to Low, because of level inversion by the inverter 76, the rising edge of the signal level-inverted by the inverter 76 is detected by the rising-edge detection unit 75, so that a positive edge detection signal is outputted for the period T1.

Accordingly, even with the pulse conversion circuit 7 shown in FIG. 4, similarly to with the pulse conversion circuit 7 shown in FIG. 2, in the transmitter coil 2 connected to both the output terminals 7b, 7c of the pulse conversion circuit 7, a positive pulse current signal $I_T+$ flows for the period T1 when the input signal $D_{IN}$ applied to the input terminal 7a of the pulse conversion circuit 7 changes from Low to High, and a negative pulse current signal $I_T-$ flows for the period T1 when the input signal $D_{IN}$ applied to the input terminal 7a of the pulse conversion circuit 7 changes from High to Low.

Note that the configurations of the pulse conversion circuit 7 shown in FIG. 2 and FIG. 4 are each just an example, so that this circuit is not limited to these configurations.

Figure 6:
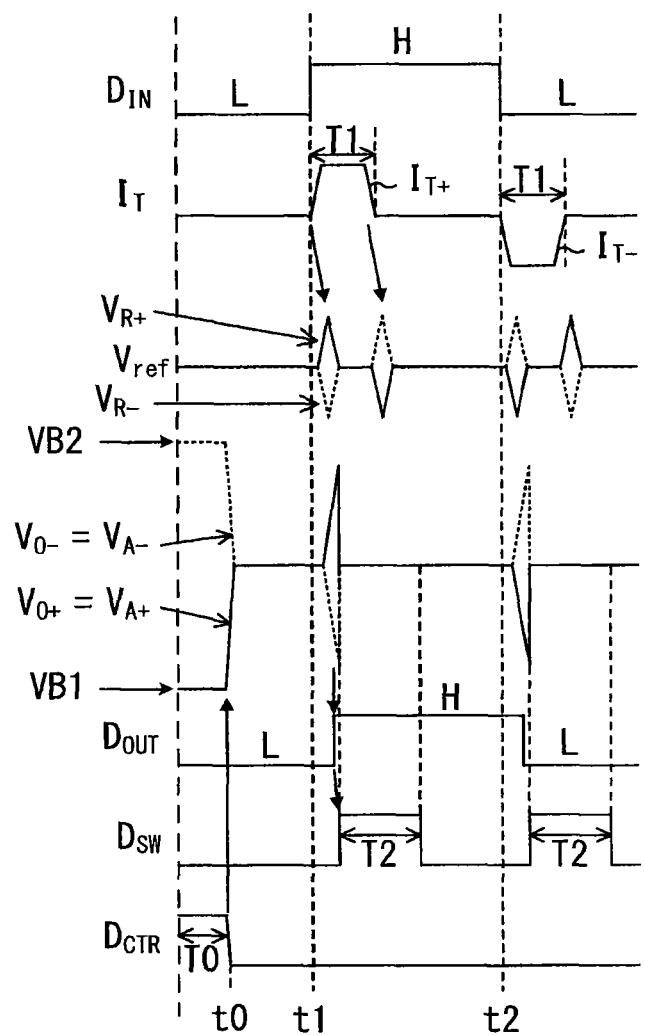
FIG. 6 is a waveform chart showing timewise changes of operation signals at respective portions in the signal transmitting circuit of Embodiment 1 of the invention in the case where an input signal is Low at the time of power turn-on or reset operation.
Figure 7:
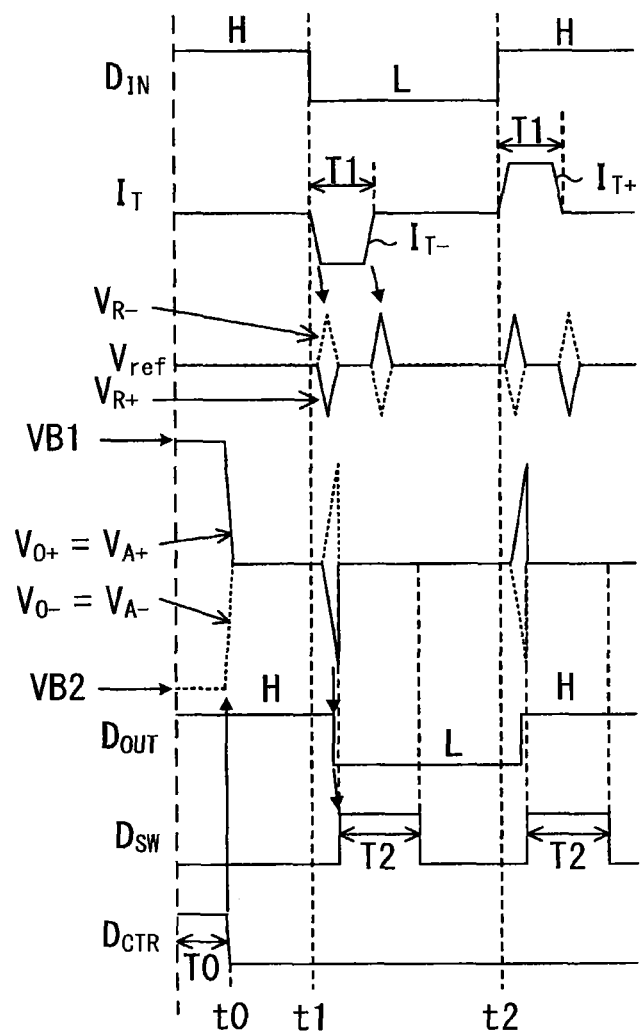
FIG. 7 is a waveform chart showing timewise changes of operation signals at the respective portions in the signal transmitting circuit of Embodiment 1 of the invention in the case where the input signal is High at the time of power turn-on or reset operation.

FIG. 6 and FIG. 7 are waveform charts each showing timewise changes of operation signals at respective portions in the signal transmitting circuit of Embodiment 1. In the followings, operations of the signal transmitting circuit of Embodiment 1 will be described with reference to these FIG. 6 and FIG. 7.

FIG. 6 is a waveform chart showing timewise changes of operation signals at the respective portions in the case where the input signal $D_{IN}$ given as transmission data is Low at the time of power turn-on or reset operation.

Herein indicated with a symbol $D_{IN}$ is an operation waveform of the input signal to the input terminal 5, indicated with IT is an operation waveform of the pulse current signal flowing in the transmitter coil 2, and indicated at $V_R+$ and $V_R-$ are each an operation waveform of the induction voltage signal of double pulses outputted from each output terminal of the receiver coil 3. Further, indicated at $V_O+$ and $V_O-$ are operation waveforms of the output signals from the respective plus-side and minus-side output terminals of the amplifier 8, which correspond, in Embodiment 1, to input signals $V_A+$ and $V_A-$ to the plus-side and minus-side input terminals of the hysteresis comparator 9. Indicated with $D_{OUT}$ is an operation waveform of the output signal outputted from the hysteresis comparator 9 to the output terminal 6, indicated with $D_{SW}$ is an operation waveform of the edge detection signal of the edge detection unit 11, and indicated with $D_{CTR}$ is an operation waveform of the control signal outputted from the control circuit 10.

Here, it is necessary to initialize the output signal $D_{OUT}$ of the hysteresis comparator 9 at the time of power turn-on or reset operation. On this occasion, whether the input signal $D_{IN}$ is Low or High at the time of power turn-on or reset operation is known beforehand. As shown in FIG. 6, when the input signal $D_{IN}$ is Low, the potential relationship between the first reference potential VB1 and the second reference potential VB2 is pre-set to be VB1<VB2.

Then, in response to the power turn-on or the reset operation, the control signal $D_{CTR}$ is outputted from the control circuit 10 to thereby turn ON both the second switch 22 and the third switch 23. This applies the first reference potential VB1 and the second reference potential VB2, respectively, to the plus-side input terminal and the minus-side input terminal of the hysteresis comparator 9. As a result, a potential difference (=VB1−VB2) applied across both the input terminals becomes a specified level or more, so that the output $D_{OUT}$ of the hysteresis comparator 9 is forcibly initialized to be Low. Note that at this time, the first switch 21 is made OFF.

After the output signal $D_{OUT}$ of the hysteresis comparator 9 is initialized to be Low in this manner, the control circuit 10 suspends outputting the control signal $D_{CTR}$ at the time when the specified period T0 elapses from the time of power turn-on or reset operation, so that the second switch 22 and the third switch 23 are both turned OFF. At this time, because the induction voltage signals $V_R+$, $V_R-$ of double pulses from the receiver coil 3 are not yet inputted to the amplifier 8, at the time when the second switch 22 and the third switch 23 are both turned OFF (time t0), the input signals $V_A+$, $V_A-$ of the hysteresis comparator 9 become the same value and the output of the hysteresis comparator 9 is still kept to be in a Low state.

As has been described using FIG. 3 and FIG. 5, at the rising time from Low to High of the input signal $D_{IN}$ (time t1), the positive pulse current signal $I_T+$ flows during the period T1 in the transmitter coil 2. Further, at the falling time from High to Low of the input signal $D_{IN}$ (time t2), the negative pulse current signal $I_T-$ flows during the period T1 in the transmitter coil 2.

Now, when the input signal $D_{IN}$ becomes High from Low at the time t1, in response thereto, the induction voltage signals $V_R+$, $V_R-$ of double pulses having both positive and negative polarities are induced due to current change of the positive pulse current signal $I_T+$ flowing in the transmitter coil 2, and outputted from the receiver coil 3. Here, in the induction voltage signals $V_R+$, $V_R-$ of double pulses outputted from the receiver coil 3, the first single pulses are inputted firstly to the amplifier 8 thereby providing the amplified output signals $V_O+$ and $V_O-$. On that occasion, because the first switch 21 is still kept OFF, the output signals $V_O+$, $V_O-$ of the amplifier 8 are given without change as the input signals $V_A+$, $V_A-$ to the hysteresis comparator 9. Further, because the difference between the output signals $V_O+$, $V_O-$ of the amplifier 8 is larger than a pre-set threshold value, the output signal $D_{OUT}$ of the hysteresis comparator 9 is inverted in level to become High from Low, to thereby decide its logic level.

When the output signal $D_{OUT}$ of the hysteresis comparator 9 becomes High from Low, this edge of the output signal $D_{OUT}$ is detected by the edge detection unit 11, and the edge detection unit 11 outputs the edge detection signal $D_{SW}$ of high level for the specified period T2. This causes, during the period T2, the first switch 21 to turn ON, so that the plus-side and minus-side input terminals of the hysteresis comparator 9 are short-circuited, and thus both the input signals $V_A+$, $V_A-$ to the hysteresis comparator 9 become at the same potential together. Thus, even when the second single pulses in the induction voltage signals $V_R+$, $V_R-$ of double pulses outputted from the receiver coil 3 are inputted to the amplifier 8, because the plus-side and minus-side input terminals of the hysteresis comparator 9 are short-circuited to become at the same potential, the difference between the input signals $V_A+$, $V_A-$ to the hysteresis comparator 9 is a pre-set threshold value or less, so that the output of the hysteresis comparator 9 is still kept to be in a High state.

As is understood from the above, the input signal $D_{IN}$ becomes High from Low at the time t1, and in association therewith, the output signal $D_{OUT}$ of the hysteresis comparator 9 becomes High from Low. Further, at the time the output signal $D_{OUT}$ becomes High from Low, the edge detection signal $D_{SW}$ of high level outputted for the specified period T2 from the edge detection unit 11 is given as a signal with respect to the hysteresis comparator 9 for setting up the insensitive period for the second single pulses in the induction voltage signals $V_R+$, $V_R-$ of double pulses.

Then, when the input signal $D_{IN}$ becomes Low from High at the time t2, in response thereto, the induction voltage signals $V_R+$, $V_R-$ of double pulses having both positive and negative polarities that are phase-inverted from those at the time t1, are induced due to current change of the negative pulse current signal $I_T-$ flowing in the transmitter coil 2, and outputted from the receiver coil 3. Here, in the induction voltage signals $V_R+$, $V_R-$ of double pulses outputted from the receiver coil 3, the first single pulses are inputted firstly to the amplifier 8 thereby providing the amplified output signals $V_O+$ and $V_O-$. On that occasion, because the first switch 21 is still kept OFF, the output signals $V_O+$, $V_O-$ of the amplifier 8 are given without change as the input signals $V_A+$, $V_A-$ to the hysteresis comparator 9. Further, because the difference between the output signals $V_O+$, $V_O-$ of the amplifier 8 is larger than a pre-set threshold value, the output signal $D_{OUT}$ of the hysteresis comparator 9 is inverted in level to become Low from High, to thereby decide its logic level.

When the output signal $D_{OUT}$ of the hysteresis comparator 9 becomes Low from High, this edge of the output signal $D_{OUT}$ is detected by the edge detection unit 11, and the edge detection unit 11 outputs the edge detection signal $D_{SW}$ of high level for the specified period T2. This causes, during the period T2, the first switch 21 to turn ON, so that the plus-side and minus-side input terminals of the hysteresis comparator 9 are short-circuited, and thus both the input signals $V_A+$, $V_A-$ to the hysteresis comparator 9 become at the same potential together. Thus, even when the second single pulses in the induction voltage signals $V_R+$, $V_R-$ of double pulses outputted from the receiver coil 3 are inputted to the amplifier 8, because the plus-side and minus-side input terminals of the hysteresis comparator 9 are short-circuited to become at the same potential, the difference between the input signals $V_A+$, $V_A-$ to the hysteresis comparator 9 is a pre-set threshold value or less, so that the output of the hysteresis comparator 9 is still kept to be in a Low state.

As is understood from the above, the input signal $D_{IN}$ becomes Low from High at the time t2, and in association therewith, the output signal $D_{OUT}$ of the hysteresis comparator 9 becomes Low from High. Further, at the time the output signal $D_{OUT}$ becomes Low from High, the edge detection signal $D_{SW}$ of high level outputted for the specified period T2 from the edge detection unit 11 is given as a signal with respect to the hysteresis comparator 9 for setting up the insensitive period for the second single pulses in the induction voltage signals $V_R+$, $V_R-$ of double pulses.

Note that the relationship between the period T2 in which the edge detection signal $D_{SW}$ is outputted that is for setting up the insensitive period for the second single pulses in the induction voltage signals $V_R+$, $V_R-$ of double pulses outputted from the receiver coil 3, and the period T1 in which the pulse current signal $I_T$ of the transmitter coil 2 changes, is pre-set to be T1<T2.

FIG. 7 is a waveform chart showing timewise changes of operation signals at the respective portions in the case where the input signal $D_{IN}$ is High at the time of power turn-on or reset operation, in which names of the respective operation signals are the same as those in the case of FIG. 6, so that description of the names of the respective operation signals is omitted.

Here, it is necessary to initialize the output signal of the hysteresis comparator 9 at the time of power turn-on or reset operation. On this occasion, whether the input signal $D_{IN}$ is Low or High at the time of power turn-on or reset operation is known beforehand. As shown in FIG. 7, when the input signal $D_{IN}$ is High, the potential relationship between the first reference potential VB1 and the second reference potential VB2 is pre-set to be VB1>VB2.

Then, in response to the power turn-on or the reset operation, the control signal $D_{CTR}$ is outputted from the control circuit 10 to thereby turn ON both the second switch 22 and the third switch 23. This applies the first reference potential VB1 and the second reference potential VB2, respectively, to the plus-side input terminal and the minus-side input terminal of the hysteresis comparator 9. As a result, a potential difference (=VB1−VB2) applied across both the input terminals becomes a specified level or more, so that the output $D_{OUT}$ of the hysteresis comparator 9 is forcibly initialized to be High. Note that at this time, the first switch 21 is made OFF.

Operation waveforms after the time of power turn-on or reset operation provide basically the same operations as those in the case of FIG. 6, except that the input signal $D_{IN}$ is being inversed in polarity at the time t1 and the time t2 shown in FIG. 6, so that description of the operation waveforms after the time of power turn-on or reset operation is omitted.

As described above, the signal transmitting circuit of Embodiment 1 of the invention initializes using the control circuit 10, the output signal $D_{OUT}$ of the hysteresis comparator 9 at the time of power turn-on or reset operation, and when the output signal $D_{OUT}$ logically changes, detects that change in level at the edge detection unit 11 to turn ON the first switch 21 to thereby forcibly short-circuit between the plus-side and minus-side input terminals of the hysteresis comparator 9, so that the input signals $V_A+$, $V_A-$ to the hysteresis comparator 9 become at the same potential. Thus, in the induction voltage signals $V_R+$, $V_R-$ of double pulses outputted from the receiver coil 3 every time the input signal $D_{IN}$ changes in logical value, the first single pulses are only amplified by the amplifier 8 and its output signals $V_O+$, $V_O-$ are applied to the hysteresis comparator 9 as the input signals $V_A+$, $V_A-$. Accordingly, there is no case where a delay time corresponding to the period T1 between the first single pulse and the second single pulse, occurs between the input signal $D_{IN}$ and the output signal $D_{OUT}$ as in the conventional case. Thus, a voltage conversion can be executed smoothly even at the time of performing an inverter control, for example. Further, since the period T2 in which the plus-side and minus-side input terminals of the hysteresis comparator 9 are short-circuited is given as the insensitive period for the inputs to the hysteresis comparator 9, it is possible to suppress an erroneous operation due to noise or chattering.

Embodiment 2

Figure 8:
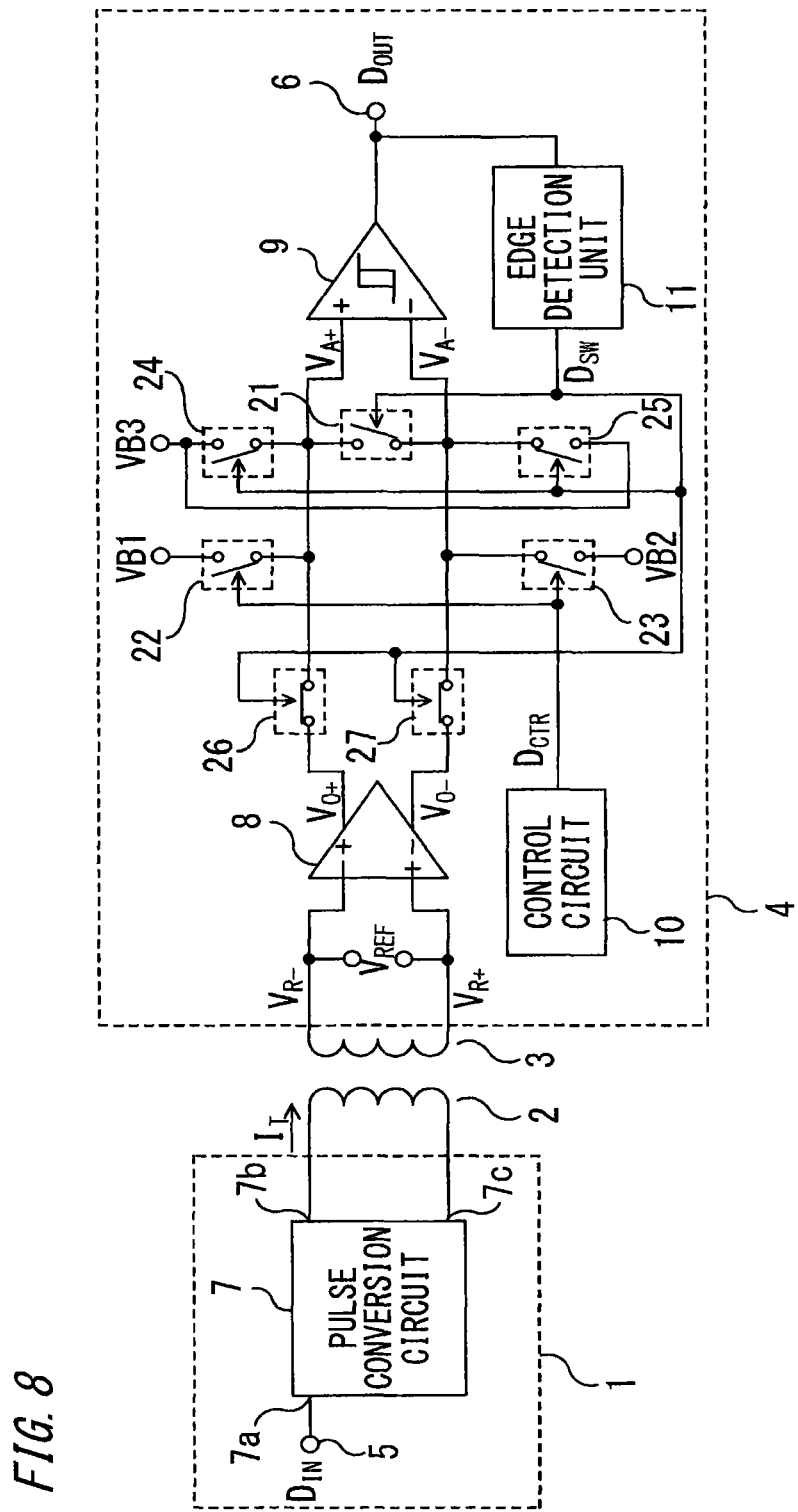
FIG. 8 is a circuit diagram showing a configuration of a signal transmitting circuit according to Embodiment 2 of the invention.

FIG. 8 is a circuit diagram showing a configuration of a signal transmitting circuit according to Embodiment 2 of the invention, in which the same reference numerals are given to the parts corresponding or equivalent to those in Embodiment 1 shown in FIG. 1.

The signal transmitting circuit of Embodiment 2 includes a transmitter circuit 1, a transmitter coil 2, a receiver coil 3 and a receiver circuit 4. In this case, the configurations of the transmitter circuit 1, the transmitter coil 2 and the receiver coil 3 are the same as the configurations in the signal transmitting circuit shown in Embodiment 1, so that their detailed description is omitted here.

The receiver circuit 4 of Embodiment 2 detects the first single pulses in the induction voltage signals $V_R+$, $V_R-$ of double pulses having both positive and negative polarities which have been induced in the inductively-coupled receiver coil 3 by the pulse current signal $I_T$ of the transmitter coil 2. Then, in response to the detection of the first single pulses, the receiver circuit 4 sets up an insensitive period for the second single pulses so as not to detect the second single pulses, to thereby generate the output signal $D_{OUT}$ resulting from demodulation of the input signal $D_{IN}$, solely on the basis of the first single pulses.

The receiver circuit 4 includes an output terminal 6 where the output signal $D_{OUT}$ resulting from demodulation of the input signal $D_{IN}$ is outputted, an amplifier 8, a hysteresis comparator 9, a control circuit 10, an edge detection unit 11, a first switch 21, a second switch 22, a third switch 23, a fourth switch 24, a fifth switch 25, a sixth switch 26, a seventh switch 27, a first reference potential VB1, a second reference potential VB2, a third reference potential VB3 and a reference potential $V_{REF}$.

The amplifier 8 serves to amplify the induction voltage signals $V_R+$, $V_R-$ of double pulses induced in the receiver coil 3. The amplifier 8 has respective two input terminals that are individually connected to respective terminals of the receiver coil 3, a plus-side output terminal that is connected to one end of the sixth switch 26, and a minus-side output terminal that is connected to one end of the seventh switch 27.

Like the case of Embodiment 1, the hysteresis comparator 9 inputs, as the input signals $V_A+$, $V_A-$, the output signals $V_O+$ and $V_O-$ resulting from amplification of the induction voltage signals $V_R+$, $V_R-$ by the amplifier 8 and outputted from its plus-side and minus-side output terminals. The hysteresis comparator 9 has a hysteresis characteristic that, when the difference between the input signals $V_A+$, $V_A-$ is a specified level or more, causes a level inversion and retains a constant output. A plus-side input terminal of the hysteresis comparator 9 is connected to one end of the sixth switch 26, a minus-side input terminal thereof is connected to one end of the seventh switch 27, and a single output terminal thereof is provided as an output terminal 6 where the output signal $D_{OUT}$ resulting from demodulation of the input signal $D_{IN}$ is outputted.

The control circuit 10 outputs a control signal $D_{CTR}$ for a specified period T0 in response to the time of power turn-on, reset operation or the like, and turns ON or OFF the second switch 22 and the third switch 23 using the control signal $D_{CTR}$. In this case, the output period T0 of the control signal $D_{CTR}$ from the control circuit 10 is pre-set by having incorporated an unshown timer circuit, etc. in the control circuit 10.

The edge detection unit 11 has an input terminal that is connected to the output terminal 6 of the above hysteresis comparator 9. The edge detection unit 11 detects both rising and falling edge components of the output signal $D_{OUT}$ of the hysteresis comparator 9, and in response to that edge detection, generates an edge detection signal $D_{SW}$ for a specified period T2 to thereby turn ON or OFF the respective first switch 21, fourth switch 24, fifth switch 25, sixth switch 26 and seventh switch 27. In this case, the output period T2 of the edge detection signal $D_{SW}$ is pre-set by having incorporated an unshown one-shot multivibrator circuit, etc. in the edge detection unit 11. The output period T2 of the edge detection signal $D_{SW}$ is provided as the insensitive period for the second single pulses in the induction voltage signals $V_R+$, $V_R-$ of the double pulses.

The first switch 21 has normally-OFF characteristic. One-side end of the first switch 21 is connected to the plus-side input terminal of the hysteresis comparator 9 and the other-side end is connected to the minus-side input terminal of the hysteresis comparator 9, and this switch turns ON or OFF depending on the polarity of the edge detection signal $D_{SW}$ from the edge detection unit 11.

The second switch 22 has normally-OFF characteristic. One-side end of the second switch 22 is connected to the first reference potential VB1 and the other-side end is connected to the plus-side input terminal of the hysteresis comparator 9, and this switch turns ON or OFF depending on the polarity of the control signal $D_{CTR}$ of the control circuit 10.

The third switch 23 has normally-OFF characteristic. One-side end of the third switch 23 is connected to the second reference potential VB2 and the other-side end is connected to the minus-side input terminal of the hysteresis comparator 9, and this switch turns ON or OFF depending on the polarity of the control signal $D_{CTR}$ of the control circuit 10.

The fourth switch 24 has normally-OFF characteristic. One-side end of the fourth switch 24 is connected to the third reference potential VB3 and the other-side end is connected to the plus-side input terminal of the hysteresis comparator 9, and this switch turns ON or OFF depending on the polarity of the edge detection signal $D_{SW}$ from the edge detection unit 11.

The fifth switch 25 has normally-OFF characteristic. One-side end of the fifth switch 25 is connected to the third reference potential VB3 and the other-side end is connected to the minus-side input terminal of the hysteresis comparator 9, and this switch turns ON or OFF depending on the polarity of the edge detection signal $D_{SW}$ from the edge detection unit 11.

The sixth switch 26 has normally-ON characteristic. One-side end of the sixth switch 26 is connected to the plus-side output terminal of the amplifier 8 and the other-side end is connected to the plus-side input terminal of the hysteresis comparator 9, and this switch turns ON or OFF depending on the polarity of the edge detection signal $D_{SW}$ from the edge detection unit 11.

The seventh switch 27 has normally-ON characteristic. One-side end of the seventh switch 27 is connected to the minus-side output terminal of the amplifier 8 and the other-side end is connected to the minus-side input terminal of the hysteresis comparator 9, and this switch turns ON or OFF depending on the polarity of the edge detection signal $D_{SW}$ from the edge detection unit 11.

Here, the sixth and seventh switches 26, 27 correspond to the output interruption switch in CLAIMS, and the first, fourth and fifth switches 21, 24, 25 correspond to the third-reference-potential applying switch group in CLAIMS.

Figure 9:
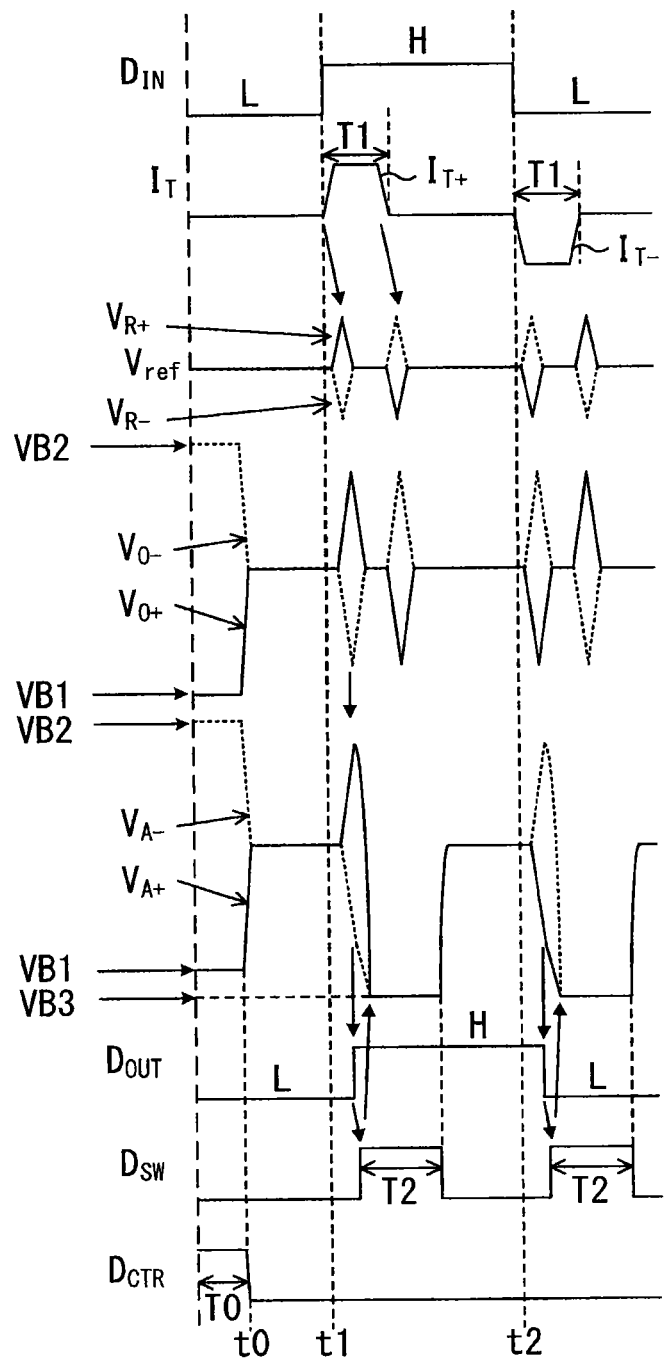
FIG. 9 is a waveform chart showing timewise changes of operation signals at respective portions in the signal transmitting circuit of Embodiment 2 of the invention in the case where an input signal is Low at the time of power turn-on or reset operation.

FIG. 9 is a waveform chart showing timewise changes of operation signals at respective portions in the signal transmitting circuit of Embodiment 2, and in particular, herein shown are those in the case where the input signal $D_{IN}$ given as transmission data is Low at the time of power turn-on or reset operation. In the followings, operations of the signal transmitting circuit of Embodiment 2 will be described with reference to FIG. 9.

In FIG. 9, indicated with a symbol $D_{IN}$ is an operation waveform of the input signal to the input terminal 5, indicated with IT is an operation waveform of the pulse current signal flowing in the transmitter coil 2, and indicated at $V_R+$ and $V_R-$ are each an operation waveform of the induction voltage signal of double pulses outputted from each output terminal of the receiver coil 3. Further, indicated at $V_O+$ and $V_O-$ are operation waveforms of the output signals from the respective plus-side and minus-side output terminals of the amplifier 8, indicated at $V_A+$ and $V_A-$ are operation waveforms of the input signals to the plus-side and minus-side input terminals of the hysteresis comparator 9, indicated with $D_{OUT}$ is an operation waveform of the output signal outputted to the output terminal 6 of the hysteresis comparator 9, indicated with $D_{SW}$ is an operation waveform of the edge detection signal of the edge detection unit 11, and indicated with $D_{CTR}$ is an operation waveform of the control signal outputted from the control circuit 10.

Here, it is necessary to initialize the output signal $D_{OUT}$ of the hysteresis comparator 9 at the time of power turn-on or reset operation. On this occasion, because whether the input signal $D_{IN}$ is Low or High at the time of power turn-on or reset operation is known beforehand, as shown in FIG. 9, the potential relationship between the first reference potential VB1 and the second reference potential VB2 is pre-set to be VB1<VB2, when the input signal $D_{IN}$ is Low.

Then, in response to the power turn-on or the reset operation, the control signal $D_{CTR}$ is outputted from the control circuit 10 to thereby turn ON both the second switch 22 and the third switch 23. This applies the first reference potential VB1 and the second reference potential VB2, respectively, to the plus-side input terminal and the minus-side input terminal of the hysteresis comparator 9. As a result, a potential difference (=VB1−VB2) applied across both the input terminals becomes a specified level or more. Thus, the output $D_{OUT}$ of the hysteresis comparator 9 is forcibly initialized to be Low. Note that at this time, the first, fourth and fifth switches 21, 24, 25 are made OFF together.

After the output signal $D_{OUT}$ of the hysteresis comparator 9 is initialized to be Low in this manner, the control circuit 10 suspends outputting the control signal $D_{CTR}$ at the time when the specified period T0 elapses from the time of power turn-on or reset operation, so that the second switch 22 and the third switch 23 are both turned OFF. At this time, because the induction voltage signals $V_R+$, $V_R-$ of double pulses from the receiver coil 3 are not yet inputted to the amplifier 8, even at the time when the second switch 22 and the third switch 23 are both turned OFF (time t0), the output signal $D_{OUT}$ of the hysteresis comparator 9 is still kept to be in a Low state.

As has been already described using FIG. 3 and FIG. 5, at the rising time from Low to High of the input signal $D_{IN}$ (time t1), the positive pulse current signal $I_T+$ flows during the period T1 in the transmitter coil 2. Further, at the falling time from High to Low of the input signal $D_{IN}$ (time t2), the negative pulse current signal $I_T-$ flows during the period T1 in the transmitter coil 2.

When the input signal $D_{IN}$ becomes High from Low at the time t1, in response thereto, the signals $V_R+$ and $V_R-$ of the respective output terminals of the receiver coil 3 respond to the change of the positive pulse current signal $I_T+$ flowing in the transmitter coil 2, so that the induction voltage signals $V_R+$, $V_R-$ of double pulses having both polarities are outputted. Here, in the induction voltage signals $V_R+$, $V_R-$ of double pulses outputted from the receiver coil 3, the first single pulses are inputted firstly to the amplifier 8 thereby providing the amplified output signals $V_O+$ and $V_O-$. On this occasion, because the sixth and seventh switches 26, 27 are made ON and the respective first, fourth and fifth switches 21, 24, 25 are made OFF, the output signals $V_O+$, $V_O-$ of the amplifier 8 are given without change as the input signals $V_A+$, $V_A-$ with the corresponding potentials to the hysteresis comparator 9. At this time, because the difference between the input signals $V_A+$, $V_A-$ to the hysteresis comparator 9 is larger than a pre-set threshold value, the output signal $D_{OUT}$ of the hysteresis comparator 9 is inverted in level to become High from Low, to thereby decide its logic level.

When the output signal $D_{OUT}$ of the hysteresis comparator 9 becomes High from Low in this manner, this edge of the output signal $D_{OUT}$ is detected by the edge detection unit 11, so that the edge detection unit 11 outputs the edge detection signal $D_{SW}$ of high level for the specified period T2. This causes, during the period T2, the sixth switch 26 and the seventh switch 27 to turn OFF to thereby disconnect between the output terminals of the amplifier 8 and the input terminals of the hysteresis comparator 9. Further, the first, fourth and fifth switches 21, 24, 25 are turned ON by the edge detection signal $D_{SW}$, so that the plus-side and minus-side input terminals of the hysteresis comparator 9 are short-circuited and both the input terminals become at the third reference potential VB3. Thus, even when the second single pulses in the induction voltage signals $V_R+$, $V_R-$ of double pulses outputted from the receiver coil 3 are inputted to the amplifier 8, the output signal $D_{OUT}$ of the hysteresis comparator 9 is still kept to in a High state, without being affected thereby at all.

In this case, with respect to the magnitude of the third reference potential VB3, it is pre-set to a potential by which the hysteresis comparator 9 does not operate. For example, in the case where the hysteresis comparator 9 is configured by an input stage of NMOS transistor, the third reference potential VB3 is determined to be a low potential by which the NMOS transistor does not operate, for example, the ground potential. Meanwhile, in the case where the hysteresis comparator 9 is configured by an input stage of PMOS transistor, the third reference potential VB3 is determined to be a high potential by which the PMOS transistor does not operate, for example, a power-source potential.

As is understood from the above description, also in Embodiment 2, similarly to Embodiment 1, the edge detection signal $D_{SW}$ of high level outputted for the specified period T2 from the edge detection unit 11 is given as a signal with respect to the hysteresis comparator 9 for setting up the insensitive period for the second single pulses in the induction voltage signals $V_R+$, $V_R-$ of double pulses.

Then, when the input signal $D_{IN}$ becomes Low from High at the time t2, in response thereto, the induction voltage signals $V_R+$, $V_R-$ of double pulses having both positive and negative polarities that are inverted from those at the time t1, are induced due to change of the negative pulse current signal $I_T-$ flowing in the transmitter coil 2, and outputted from the receiver coil 3. Here, in the induction voltage signals $V_R+$, $V_R-$ of double pulses outputted from the receiver coil 3, the first single pulses are inputted firstly to the amplifier 8 thereby providing the amplified output signals $V_O+$ and $V_O-$. On this occasion, because the sixth and seventh switches 26, 27 are made ON and the respective first, fourth and fifth switches 21, 24, 25 are made OFF, the output signals $V_O+$, $V_O-$ of the amplifier 8 are given without change as the input signals $V_A+$, $V_A-$ with the corresponding potentials to the hysteresis comparator 9. At this time, because the difference between the input signals $V_A+$, $V_A-$ to the hysteresis comparator 9 is larger than a pre-set threshold value, the output signal $D_{OUT}$ of the hysteresis comparator 9 is inverted in level to become Low from High, to thereby decide its logic level.

When the output signal $D_{OUT}$ of the hysteresis comparator 9 becomes Low from High in this manner, this edge of the output signal $D_{OUT}$ is detected by the edge detection unit 11, so that the edge detection unit 11 outputs the edge detection signal $D_{SW}$ of high level for the specified period T2. This causes, during the period T2, the sixth switch 26 and the seventh switch 27 to turn OFF to thereby disconnect between the output terminals of the amplifier 8 and the input terminals of the hysteresis comparator 9. Further, the respective first, fourth and fifth switches 21, 24, 25 are turned ON by the edge detection signal $D_{SW}$, so that the plus-side and minus-side input terminals of the hysteresis comparator 9 are short-circuited and both the input terminals become at the third reference potential VB3. Thus, even when the second single pulses in the induction voltage signals $V_R+$, $V_R-$ of double pulses outputted from the receiver coil 3 are inputted to the amplifier 8, the output signal $D_{OUT}$ of the hysteresis comparator 9 is still kept to in a Low state, without being affected thereby at all.

Further, also in this case, the edge detection signal $D_{SW}$ of high level outputted for the specified period T2 from the edge detection unit 11 is given as a signal with respect to the hysteresis comparator 9 for setting up the insensitive period for the second single pulses in the induction voltage signals $V_R+$, $V_R-$ of double pulses.

Note that the relationship between the period T2 in which the edge detection signal $D_{SW}$ is outputted that is for setting up the insensitive period so that the second single pulses in the induction voltage signals $V_R+$, $V_R-$ of double pulses outputted from the receiver coil 3 are not inputted to the hysteresis comparator 9 after amplified by the amplifier 8, and the period T1 in which the pulse current signal $I_T$ of the transmitter coil 2 changes, is pre-set to be T1<T2.

Note that in FIG. 9, there are shown the operation waveforms in the case where the input signal $D_{IN}$ is Low at the time of power turn-on or reset operation; however, in the case where the input signal $D_{IN}$ is High at the time of power turn-on or reset operation, the potential relationship between the first reference potential VB1 and the second reference potential VB2 is set to be VB1>VB2. Then, by turning ON the second switch 22 and the third switch 23 using the control signal $D_{CTR}$ of the control circuit 10, the output voltage of the hysteresis comparator 9 is initialized to be High. Further, in the case where the input signal $D_{IN}$ is High at the time of power turn-on or reset operation, operation waveforms after that time provide basically the same operations as those in the case of FIG. 9 except only that the input signal $D_{IN}$ is being inverted in polarity at the time t1 and the time t2 shown in FIG. 9, so that description of the operation waveforms after the time of power turn-on or reset operation is omitted.

As described above, the signal transmitting circuit of Embodiment 2 of the invention initializes using the control circuit 10 the output signal $D_{OUT}$ of the hysteresis comparator 9 at the time of power turn-on or reset operation, and when the output signal $D_{OUT}$ logically changes, detects that change in level at the edge detection unit 11 to turn OFF the sixth and seventh switches 26, 27 to thereby forcibly disconnect between the output terminals of the amplifier 8 and the input terminals of the hysteresis comparator 9. Thus, in the induction voltage signals $V_R+$, $V_R-$ of double pulses outputted from the receiver coil 3 every time the input signal $D_{IN}$ changes in logical value, the first single pulses are only inputted to the hysteresis comparator 9 after amplified by the amplifier 8. Accordingly, there is no case where a delay corresponding to the period T1 between the first single pulse and the second single pulse occurs between the input signal $D_{IN}$ and the output signal $D_{OUT}$ as in the conventional case, and further, it is possible to surely avoid an influence of the output signals $V_O+$, $V_O-$ from the amplifier 8. Thus, a voltage conversion can be executed smoothly even at the time of performing an inverter control, for example.

Further, when the sixth and seventh switches 26, 27 are turned OFF for the specified period T2 by the edge detection signal $D_{SW}$ from the edge detection unit 11, at the same time, the respective first, fourth and fifth switches 21, 24, 25 are turned ON so that the plus-side and minus-side input terminals of the hysteresis comparator 9 are short-circuited and the third reference potential VB3 by which the hysteresis comparator 9 does not operate is applied to the respective input terminals of the hysteresis comparator 9. Thus, during the period T2, an erroneous operation due to noise or chattering can be suppressed, and further, an erroneous operation due to influence of the offset voltage of the hysteresis comparator 9 can be suppressed.

Embodiment 3

Figure 10:
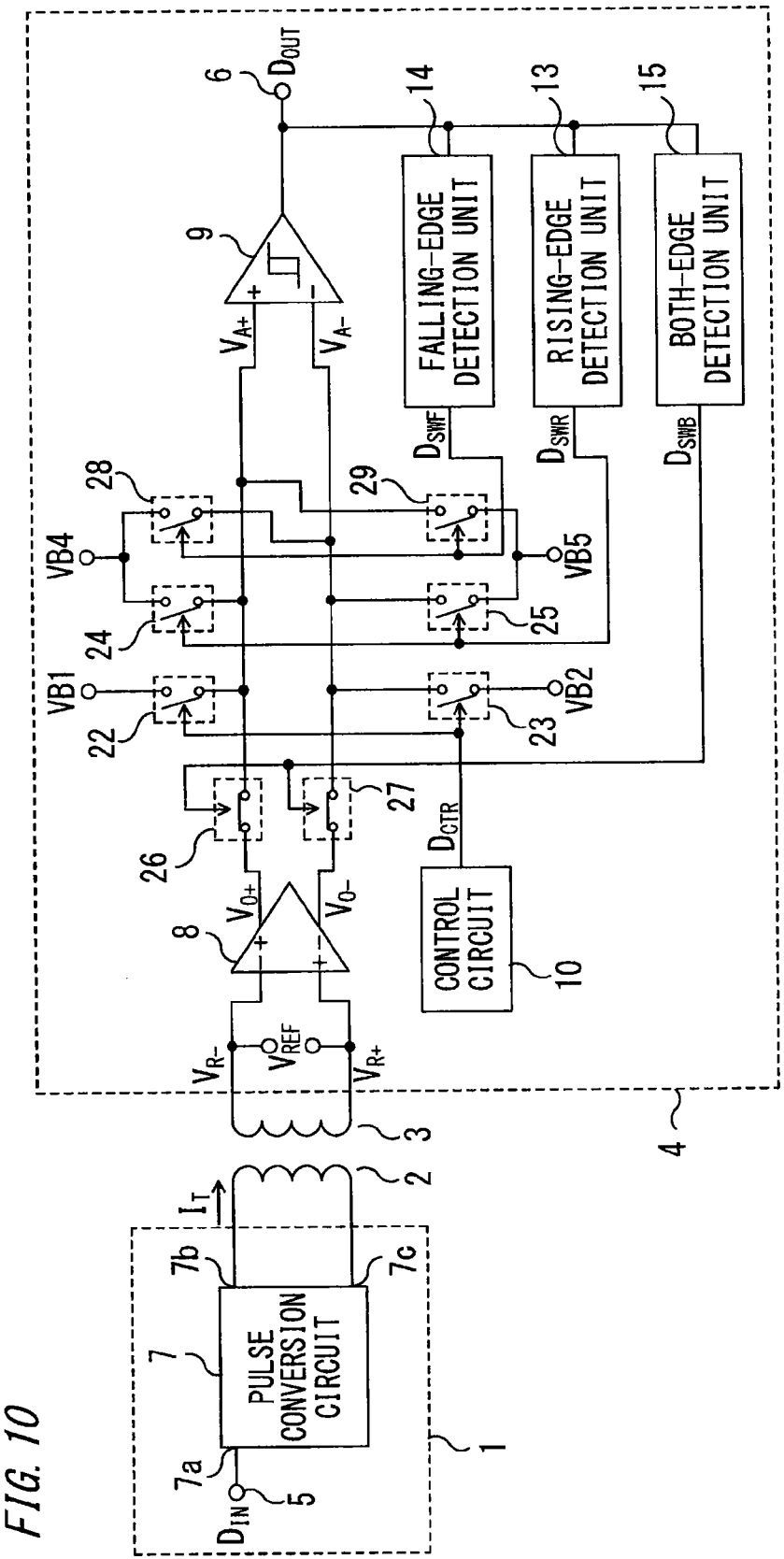
FIG. 10 is a circuit diagram showing a configuration of a signal transmitting circuit according to Embodiment 3 of the invention.

FIG. 10 is a circuit diagram showing a configuration of a signal transmitting circuit according to Embodiment 3 of the invention, in which the same reference numerals are given to the configuration parts corresponding or equivalent to those in Embodiment 2 shown in FIG. 8.

The signal transmitting circuit of Embodiment 3 includes a transmitter circuit 1, a transmitter coil 2, a receiver coil 3 and a receiver circuit 4. In this case, the configurations of the transmitter circuit 1, the transmitter coil 2 and the receiver coil 3 are the same as the configurations in the signal transmitting circuit shown in Embodiment 1, so that their detailed description is omitted here.

The receiver circuit 4 of Embodiment 3 is a circuit that, when detecting the first single pulses in the induction voltage signals $V_R+$, $V_R-$ of double pulses having both positive and negative polarities which have been induced in the inductively-coupled receiver coil 3 by the pulse current signal $I_T$ of the transmitter coil 2, in response thereto, sets up the insensitive period for the second single pulses so as not to detect the second single pulses, to thereby generate the output signal $D_{OUT}$ resulting from demodulation of the above input signal $D_{IN}$, solely on the basis of the first single pulses.

The receiver circuit 4 includes an output terminal 6 where the output signal $D_{OUT}$ resulting from demodulation of the input signal $D_{IN}$ is outputted, an amplifier 8, a hysteresis comparator 9, a control circuit 10, a rising-edge detection unit 13, a falling-edge detection unit 14, a both-edge detection unit 15, a second switch 22, a third switch 23, a fourth switch 24, a fifth switch 25, a sixth switch 26, a seventh switch 27, an eighth switch 28, a ninth switch 29, a first reference potential VB1, a second reference potential VB2, a fourth reference potential VB4, a fifth reference potential VB5 and a reference potential $V_{REF}$.

The amplifier 8 amplifies the induction voltage signals $V_R+$, $V_R-$ of double pulses induced in the receiver coil 3. The amplifier 8 has two input terminals that are individually connected to respective terminals of the receiver coil 3, a plus-side output terminal that is connected to one end of the sixth switch 26, and a minus-side output terminal that is connected to one end of the seventh switch 27.

Like the cases of Embodiments 1 and 2, the hysteresis comparator 9 inputs, as the input signals $V_A+$, $V_A-$, the output signals $V_O+$ and $V_O-$ resulting from amplification of the induction voltage signals $V_R+$, $V_R-$ by the amplifier 8 and outputted from the respective plus-side and minus-side output terminals of the amplifier 8. The hysteresis comparator 9 has a hysteresis characteristic that, when the difference between the input signals $V_A+$, $V_A-$ is a specified level or more, causes a level inversion and retains a constant output. The plus-side input terminal of the hysteresis comparator 9 is connected to one end of the sixth switch 26, the minus-side input terminal thereof is connected to one end of the seventh switch 27, and the single output terminal thereof is provided as the output terminal 6 where the output signal $D_{OUT}$ resulting from demodulation of the input signal $D_{IN}$ is outputted.

The control circuit 10 outputs a control signal $D_{CTR}$ for a specified period T0 in response to the time of power turn-on, reset operation or the like, and turns ON or OFF the second switch 22 and the third switch 23 using the control signal $D_{CTR}$. In this case, the output period T0 of the control signal $D_{CTR}$ from the control circuit 10 is pre-set by having incorporated an unshown timer circuit, etc. in the control circuit 10.

The rising-edge detection unit 13 has an input portion that is connected to the output terminal 6, and detects a rising edge component of the output signal $D_{OUT}$ of the hysteresis comparator 9. Then, in response to the detection of the rising edge, the rising-edge detection unit 13 generates a rising-edge detection signal $D_{SWR}$ for a specified period T3 to thereby turn ON or OFF the fourth switch 24 and the fifth switch 25.

The falling-edge detection unit 14 has an input portion that is connected to the output terminal 6, and detects a falling edge component of the output signal $D_{OUT}$ of the hysteresis comparator 9. Then, in response to the detection of the falling edge, the falling-edge detection unit 14 generates a falling-edge detection signal $D_{SWF}$ for a specified period T4 to thereby turn ON or OFF the eighth switch 28 and the ninth switch 29.

The both-edge detection unit 15 has an input portion that is connected to the output terminal 6, and detects both rising and falling edge components of the output signal $D_{OUT}$ of the hysteresis comparator 9. Then, in response to the detection of said both edges, the both-edge detection unit 15 generates an edge detection signal $D_{SWB}$ for the specified period T2 to thereby turn ON or OFF the sixth switch 26 and the seventh switch 27.

Note that the output periods T3, T4, T2 of the edge detection signals $D_{SWR}$, $D_{SWF}$, $D_{SWB}$ outputted respectively from the respective edge detection units 13, 14, 15, are pre-set by having incorporated an unshown one-shot multivibrator circuit, etc. in each of the edge detection units 13, 14, 15. Further, the output period T2 of the edge detection signal $D_{SWB}$ outputted from the both-edge detection unit 15 is provided as the insensitive period for the second single pulses in the induction voltage signals $V_R+$, $V_R-$ of double pulses.

The second switch 22 has normally-OFF characteristic. One-side end of the second switch 22 is connected to the first reference potential VB1 and the other-side end is connected to the plus-side input terminal of the hysteresis comparator 9, and this switch turns ON or OFF depending on the polarity of the control signal $D_{CTR}$ of the control circuit 10.

The third switch 23 has normally-OFF characteristic. One-side end of the third switch 23 is connected to the second reference potential VB2 and the other-side end is connected to the minus-side input terminal of the hysteresis comparator 9, and this switch turns ON or OFF depending on the polarity of the control signal $D_{CTR}$ of the control circuit 10.

The fourth switch 24 has normally-OFF characteristic. One-side end of the fourth switch 24 is connected to the fourth reference potential VB4 and the other-side end is connected to the plus-side input terminal of the hysteresis comparator 9, and this switch turns ON or OFF depending on the polarity of the output signal $D_{SWR}$ of the rising-edge detection unit 13.

The fifth switch 25 has normally-OFF characteristic. One-side end of the fifth switch 25 is connected to the fifth reference potential VB5 and the other-side end is connected to the minus-side input terminal of the hysteresis comparator 9, and this switch turns ON or OFF depending on the polarity of the output signal $D_{SWR}$ of the rising-edge detection unit 13.

The sixth switch 26 has normally-ON characteristic. One-side end of the sixth switch 26 is connected to the plus-side output terminal of the amplifier 8 and the other-side end is connected to the plus-side input terminal of the hysteresis comparator 9, and this switch turns ON or OFF depending on the polarity of the edge detection signal $D_{SWB}$ from the both-edge detection unit 15.

The seventh switch 27 has normally-ON characteristic. One-side end of the seventh switch 27 is connected to the minus-side output terminal of the amplifier 8 and the other-side end is connected to the minus-side input terminal of the hysteresis comparator 9, and this switch turns ON or OFF depending on the polarity of the edge detection signal $D_{SWB}$ from the both-edge detection unit 15.

The eighth switch 28 has normally-OFF characteristic. One-side end of the eighth switch 28 is connected to the fourth reference potential VB4 and the other-side end is connected to the minus-side input terminal of the hysteresis comparator 9, and this switch turns ON or OFF depending on the polarity of the output signal $D_{SWF}$ of the falling-edge detection unit 14.

The ninth switch 29 has normally-OFF characteristic. One end of the ninth switch 29 is connected to the fifth reference potential VB5 and the other-side end is connected to the plus-side input terminal of the hysteresis comparator 9, and this switch turns ON or OFF depending on the polarity of the output signal $D_{SWF}$ of the falling-edge detection unit 14.

Here, the sixth and seventh switches 26, 27 correspond to the output interruption switch in CLAIMS, the fourth and eighth switches 24, 28 correspond to the fourth-reference-potential applying switch group in CLAIMS, and the fifth and ninth switches 25, 29 correspond to the fifth-reference-potential applying switch group in CLAIMS.

Figure 11:
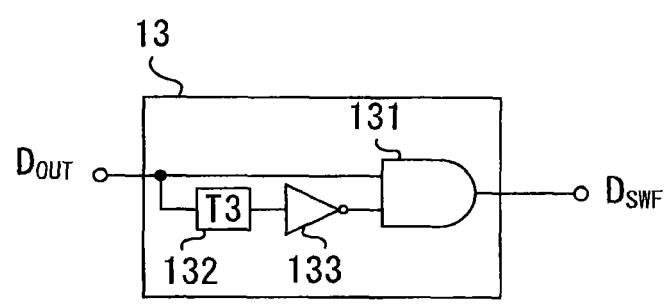
FIG. 11 is a circuit diagram showing a configuration of a rising-edge detection unit in the signal transmitting circuit according to Embodiment 3 of the invention.
Figure 12:
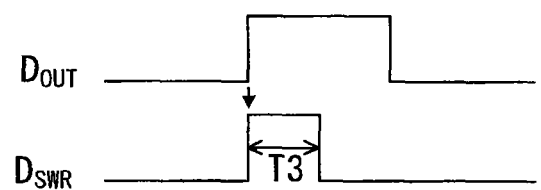
FIG. 12 is an operation waveform chart of the rising-edge detection unit according to Embodiment 3 of the invention.

FIG. 11 is a circuit diagram showing a configuration example of the rising-edge detection unit 13, and FIG. 12 is its operation waveform chart.

The rising-edge detection unit 13 in FIG. 11 includes an AND circuit 131, a delay circuit 132 and an inverter 133.

The AND circuit 131 has two input terminals, one-side end of which is connected to the output terminal 6 of the hysteresis comparator 9 and the other-side end of which is connected to an output terminal of the inverter 133, and the rising-edge detection signal $D_{SWF}$ is outputted from an output terminal of the AND circuit 131. The delay circuit 132 has an input terminal that is connected to the output terminal 6 of the hysteresis comparator 9, and an output terminal that is connected to an input terminal of the inverter 133. The delay time between the input signal and the output signal of the delay circuit 132 is herein set to the period T3. The inverter 133 has the input terminal that is connected to the output terminal of the delay circuit 132, and the output terminal that is connected to the one end of the input terminals of the AND circuit 131.

Accordingly, at the rising-edge detection unit 13 with the configuration of FIG. 11, as shown in FIG. 12, when the output signal $D_{OUT}$ from the hysteresis comparator 9 changes from Low to High, in response thereto, the rising-edge detection signal $D_{SWR}$ of high level is outputted for the period T3. Note that the configuration of the rising-edge detection unit 13 in FIG. 11 is an example and thus this unit is not limited to that configuration.

Figure 13:
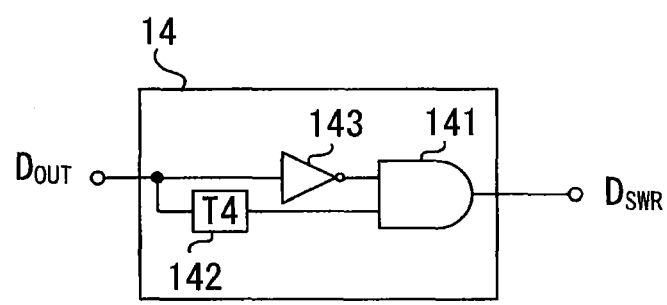
FIG. 13 is a circuit diagram showing a configuration of a falling-edge detection unit in the signal transmitting circuit according to Embodiment 3 of the invention.
Figure 14:
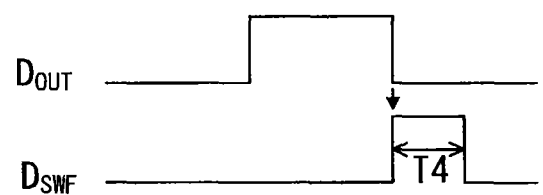
FIG. 14 is an operation waveform chart of the falling-edge detection unit according to Embodiment 3 of the invention.

FIG. 13 is a circuit diagram showing a configuration example of the falling-edge detection unit 14, and FIG. 14 is its operation waveform chart.

The falling-edge detection unit 14 in FIG. 13 includes an AND circuit 141, a delay circuit 142 and an inverter 143.

The AND circuit 141 has two input terminals, one-side end of which is connected to an output terminal of the inverter 143 and the other-side end of which is connected to an output terminal of the delay circuit 142, and the falling-edge detection signal $D_{SWF}$ is outputted from an output terminal of the AND circuit 141. The delay circuit 142 has an input terminal that is connected to the output terminal 6 of the hysteresis comparator 9, and the output terminal that is connected to the other-side input terminal of the AND circuit 141. The delay time between the input signal and the output signal of the delay circuit 142 is herein set to the period T4. The inverter 143 has an input terminal that is connected to the output terminal 6 of the hysteresis comparator 9, and the output terminal that is connected to the one-side input terminal of the AND circuit 141.

Accordingly, at the falling-edge detection unit 14 with the configuration of FIG. 13, as shown in FIG. 14, when the output signal $D_{OUT}$ from the hysteresis comparator 9 changes from High to Low, in response thereto, the falling-edge detection signal $D_{SWF}$ of high level is outputted for the period T4. Note that the configuration of the falling-edge detection unit 14 in FIG. 13 is an example and thus this unit is not limited to that configuration.

Figure 15:
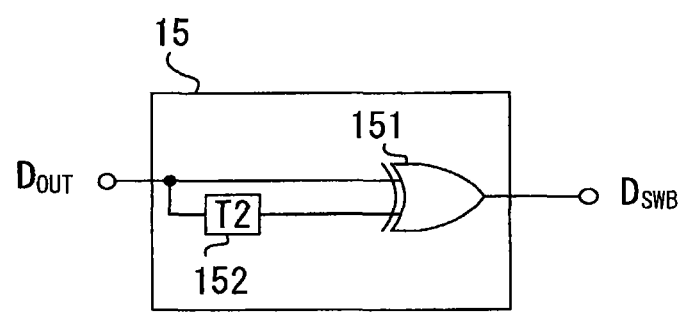
FIG. 15 is a circuit diagram showing a configuration of a both-edge detection unit in the signal transmitting circuit according to Embodiment 3 of the invention.
Figure 16:
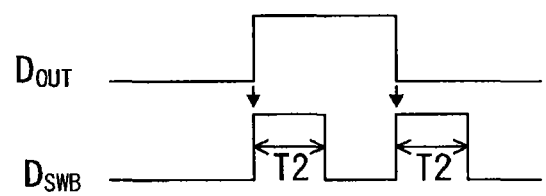
FIG. 16 is an operation waveform chart of the both-edge detection unit in the signal transmitting circuit according to Embodiment 3 of the invention.

FIG. 15 is a circuit diagram showing a configuration example of the both-edge detection unit 15, and FIG. 16 is its operation waveform chart.

The both-edge detection unit 15 in FIG. 15 includes an XOR circuit 151 and a delay circuit 152.

The XOR circuit 151 has two input terminals, one-side end of which is connected to the output terminal 6 of the hysteresis comparator 9 and the other-side end of which is connected to an output terminal of the delay circuit 152, and the edge detection signal $D_{SWB}$ is outputted from an output terminal of the XOR circuit 151. The delay circuit 152 has an input terminal that is connected to the output terminal 6 of the hysteresis comparator 9, and the output terminal that is connected to the other-side input terminal of the XOR circuit 151. The delay time between the input signal and the output signal of the delay circuit 152 is herein set to the period T2.

Accordingly, at the both-edge detection unit 15 with the configuration of FIG. 15, as shown in FIG. 16, in either case where the output signal $D_{OUT}$ from the hysteresis comparator 9 changes from Low to High or changes from High to Low, in response thereto, the edge detection signal $D_{SWB}$ of high level is outputted for the period T2. Note that the configuration of the both-edge detection unit 15 in FIG. 15 is an example and thus this unit is not limited to that configuration.

Here, the relationship between the period T2 in which the edge detection signal $D_{SWB}$ of the both-edge detection unit 15 is outputted and the period T3 in which the rising-edge detection signal $D_{SWR}$ of the rising-edge detection unit 13 is outputted, is set to be T2>T3. In addition, the rising-edge detection signal $D_{SWR}$ of the rising-edge detection unit 13 is set to become High after the edge detection signal $D_{SWB}$ of the both-edge detection unit 15 becomes High, and to become Low after the edge detection signal $D_{SWB}$ of the both-edge detection unit 15 becomes Low.

Further, the relationship between the period T2 in which the edge detection signal $D_{SWB}$ of the both-edge detection unit 15 is outputted and the period T4 in which the falling-edge detection signal $D_{SWF}$ of the falling-edge detection unit 14 is outputted, is set to be T2>T4. In addition, the falling-edge detection signal $D_{SWF}$ of the falling-edge detection unit 14 is set to become High after the edge detection signal $D_{SWB}$ of the both-edge detection unit 15 becomes High, and to become Low after the edge detection signal $D_{SWB}$ of the both-edge detection unit 15 becomes Low.

Figure 17:
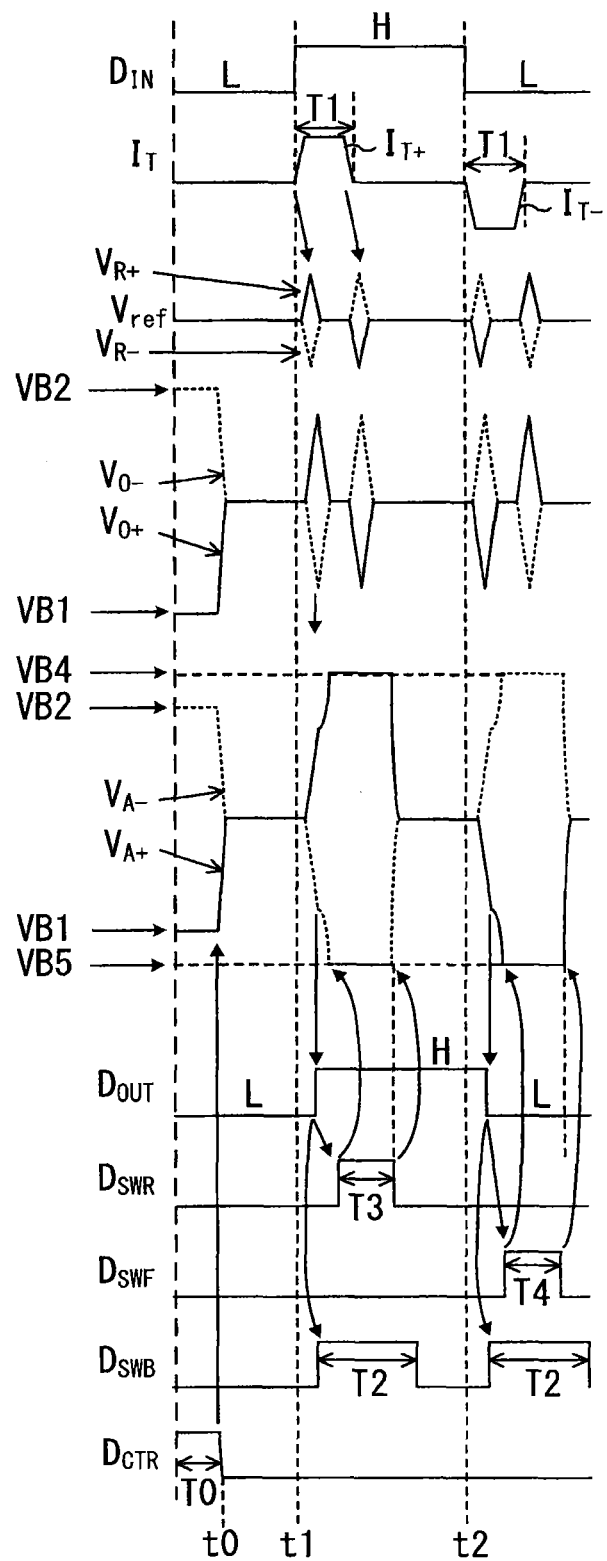
FIG. 17 is a waveform chart showing timewise changes of operation signals at respective portions in the signal transmitting circuit of Embodiment 3 of the invention in the case where an input signal is Low at the time of power turn-on or reset operation.

FIG. 17 is a waveform chart showing timewise changes of operation signals at respective portions in the signal transmitting circuit of Embodiment 3, and in particular, shown in FIG. 17 are those in the case where the input signal $D_{IN}$ given as the transmission data is Low at the time of power turn-on or reset operation. In the followings, operations of the signal transmitting circuit of Embodiment 3 will be described with reference to FIG. 17.

In FIG. 17, indicated with a symbol $D_{IN}$ is an operation waveform of the input signal to the input terminal 5, indicated with IT is an operation waveform of the pulse current signal flowing in the transmitter coil 2, and indicated at $V_R+$ and $V_R-$ are each an operation waveform of the induction voltage signal of double pulses outputted from each output terminal of the receiver coil 3. Further, indicated at $V_O+$ and $V_O-$ are operation waveforms of the output signals from the respective plus-side and minus-side output terminals of the amplifier 8, indicated at $V_A+$, $V_A-$ are operation waveforms of the input signals to the plus-side and minus-side input terminals of the hysteresis comparator 9, and indicated with $D_{OUT}$ is an operation waveform of the output signal outputted to the output terminal 6 of the hysteresis comparator 9. Further, indicated with $D_{SWR}$ is an operation waveform of the rising-edge detection signal outputted from the rising-edge detection unit 13, indicated with $D_{SWF}$ is an operation waveform of the falling-edge detection signal outputted from the falling-edge detection unit 14, indicated with $D_{SWB}$ is an operation waveform of the edge detection signal outputted from the both-edge detection unit 15, and indicated with $D_{CTR}$ is an operation waveform of the control signal outputted from the control circuit 10.

Here, it is necessary to initialize the output signal $D_{OUT}$ of the hysteresis comparator 9 at the time of power turn-on or reset operation. On this occasion, because whether the input signal $D_{IN}$ is Low or High at the time of power turn-on or reset operation is known beforehand, as shown in FIG. 17, the potential relationship between the first reference potential VB1 and the second reference potential VB2 is pre-set to be VB1<VB2, when the input signal $D_{IN}$ is Low.

Then, in response to the power turn-on or the reset operation, the control signal $D_{CTR}$ is outputted from the control circuit 10 to thereby turn ON both the second switch 22 and the third switch 23. This applies the first reference potential VB1 and the second reference potential VB2, respectively, to the plus-side input terminal and the minus-side input terminal of the hysteresis comparator 9. As a result, a potential difference (=VB1−VB2) applied across both the input terminals of the hysteresis comparator 9 becomes a specified level or more, so that the output $D_{OUT}$ of the hysteresis comparator 9 is forcibly initialized to be Low. Note that at this time, the respective fourth, fifth, eighth and ninth switches 24, 25, 28, 29 are made OFF together.

After the output signal $D_{OUT}$ of the hysteresis comparator 9 is initialized to be Low in this manner, the control circuit 10 suspends outputting the control signal $D_{CTR}$ at the time when the specified period T0 elapses from the time of power turn-on or reset operation, so that the second switch 22 and the third switch 23 are both turned OFF. At this time, because the induction voltage signals $V_R+$, $V_R-$ of double pulses from the receiver coil 3 are not yet inputted to the amplifier 8, even at the time when the second switch 22 and the third switch 23 are both turned OFF (time t0), the output of the hysteresis comparator 9 is still kept to be in a Low state.

As has been already described using FIG. 3 and FIG. 5, at the rising time from Low to High of the input signal $D_{IN}$ (time t1), the positive pulse current signal $I_T+$ flows during the period T1 in the transmitter coil 2. Further, at the falling time from High to Low of the input signal $D_{IN}$ (time t2), the negative pulse current signal $I_T-$ flows during the period T1 in the transmitter coil 2.

Now, when the input signal $D_{IN}$ becomes High from Low at the time t1, in response thereto, the signals $V_R+$ and $V_R-$ of the respective output terminals of the receiver coil 3 are induced due to change of the positive pulse current signal $I_T+$ flowing in the transmitter coil 2, so that the induction voltage signals $V_R+$, $V_R-$ of double pulses having both positive and negative polarities are outputted. Here, in the induction voltage signals $V_R+$, $V_R-$ of double pulses outputted from the receiver coil 3, the first single pulses are inputted firstly to the amplifier 8 thereby providing the amplified output signals $V_O+$ and $V_O-$. On that occasion, because the sixth and seventh switches 26, 27 are made ON and the respective fourth, fifth, eighth and ninth switches 24, 25, 28, 29 are made OFF, the output signals $V_O+$, $V_O-$ of the amplifier 8 are given without change as the input signals $V_A+$, $V_A-$ with the corresponding potentials to the hysteresis comparator 9. At this time, because the difference between the input signals $V_A+$, $V_A-$ to the hysteresis comparator 9 is larger thane pre-set threshold value, the output signal $D_{OUT}$ of the hysteresis comparator 9 is inverted in level to become High from Low, to thereby decide its logic level.

When the output signal $D_{OUT}$ of the hysteresis comparator 9 becomes High from Low in this manner, this rising edge of the output signal $D_{OUT}$ is detected by the both-edge detection unit 15, so that the both-edge detection unit 15 outputs the edge detection signal $D_{SWB}$ for the specified period T2. This causes, during the period T2, the sixth switch 26 and the seventh switch 27 to turn OFF to thereby disconnect between the output terminals of the amplifier 8 and the input terminals of the hysteresis comparator 9.

In addition, when the output signal $D_{OUT}$ of the hysteresis comparator 9 becomes High from Low, this rising edge of the output signal $D_{OUT}$ is detected by the rising-edge detection unit 13, so that the rising-edge detection unit 13 outputs the rising-edge detection signal $D_{SWR}$ for the specified period T3. Because of the rising-edge detection signal $D_{SWR}$, the fourth switch 24 and the fifth switch 25 are both turned ON, so that the plus-side input terminal of the hysteresis comparator 9 becomes at the fourth reference potential VB4 and the minus-side input terminal thereof becomes at the fifth reference potential VB5.

As described above, the sixth switch 26 and the seventh switch 27 are made OFF while the edge detection signal $D_{SWB}$ is being outputted for the specified period T2, to thereby disconnect between the output terminals of the amplifier 8 and the input terminals of the hysteresis comparator 9. Thus, even when the second single pulses in the induction voltage signals $V_R+$, $V_R-$ of double pulses outputted from the receiver coil 3 are inputted to and amplified by the amplifier 8, they are not inputted to the plus-side and minus-side input terminals of the hysteresis comparator 9, and instead, the fourth reference potential VB4 and the fifth reference potential VB5 are applied thereto for the period T3. In this case, with respect to the magnitude of the fourth reference potential VB4 and the fifth reference potential VB5, a large potential difference is provided therebetween that is sufficient not to cause inversion in polarity of the output signal of the hysteresis comparator 9, and the relationship between the fourth reference potential VB4 and the fifth reference potential VB5 is pre-set to be VB4>VB5. Thus, even when the second single pulses in the induction voltage signals $V_R+$, $V_R-$ of double pulses are inputted to the amplifier 8, the output signal $D_{OUT}$ of the hysteresis comparator 9 is still kept to be in a High state in a stable manner, without being affected thereby at all and without being affected by noise as well.

As is understood from the above, the edge detection signal $D_{SWB}$ of high level that is outputted for the specified period T2 from the both-edge detection unit 15 when the output signal $D_{OUT}$ of the hysteresis comparator 9 is inverted in level from Low to High at the time t1, is given as a signal with respect to the hysteresis comparator 9 for setting up the insensitive period for the second single pulses in the induction voltage signals $V_R+$, $V_R-$ of double pulses.

Then, the input signal $D_{IN}$ becomes Low from High at the time t2, and in response thereto, the induction voltage signals $V_R+$, $V_R-$ of double pulses having both positive and negative polarities that are phase-inverted from those at the time t1, are induced due to change of the negative pulse current signal $I_T-$ flowing in the transmitter coil 2, and outputted from the receiver coil 3. Here, in the induction voltage signals $V_R+$, $V_R-$ of double pulses outputted from the receiver coil 3, the first single pulses are inputted firstly to the amplifier 8 thereby providing the amplified output signals $V_O+$ and $V_O-$. On that occasion, because the sixth and seventh switches 26, 27 are made ON and the respective fourth, fifth, eighth and ninth switches 24, 25, 28, 29 are made OFF, the output signals $V_O+$, $V_O-$ of the amplifier 8 are given without change as the input signals $V_A+$, $V_A-$ with the corresponding potentials to the hysteresis comparator 9. At this time, because the difference between the input signals $V_A+$, $V_A-$ to the hysteresis comparator 9 is larger than a pre-set threshold value, the output signal $D_{OUT}$ of the hysteresis comparator 9 is inverted in level to become Low from High, to thereby decide its logic level.

When the output signal $D_{OUT}$ of the hysteresis comparator 9 becomes Low from High in this manner, the falling edge of the output signal $D_{OUT}$ is detected by the both-edge detection unit 15, so that the both-edge detection unit 15 outputs the edge detection signal $D_{SWB}$ of high level for the specified period T2. This causes, during the period T2, the sixth switch 26 and the seventh switch 27 to turn OFF to thereby disconnect between the output terminals of the amplifier 8 and the input terminals of the hysteresis comparator 9.

In addition, when the output signal $D_{OUT}$ of the hysteresis comparator 9 becomes Low from High, the falling edge of the output signal $D_{OUT}$ is detected by the falling-edge detection unit 14, so that the falling-edge detection unit 14 outputs the falling-edge detection signal $D_{SWF}$ for the specified period T4. Because of the falling-edge detection signal $D_{SWF}$, the eighth switch 28 and the ninth switch 29 are both turned ON, so that the plus-side input terminal of the hysteresis comparator 9 becomes at the fifth reference potential VB5 and the minus-side input terminal of the hysteresis comparator 9 becomes at the fourth reference potential VB4.

As described above, the sixth switch 26 and the seventh switch 27 are made OFF while the edge detection signal $D_{SWB}$ is being outputted for the specified period T2, to thereby disconnect between the output terminals of the amplifier 8 and the input terminals of the hysteresis comparator 9. Thus, even when the second single pulses in the induction voltage signals $V_R+$, $V_R-$ of double pulses outputted from the receiver coil 3 are inputted to and amplified by the amplifier 8, they are not inputted to the plus-side and minus-side input terminals of the hysteresis comparator 9, and instead, the fourth reference potential VB4 and the fifth reference potential VB5 are applied thereto for the period T4. In this case, the magnitude of the fourth reference potential VB4 and the fifth reference potential VB5 is given by VB4>VB5 as aforementioned, and a large potential difference is provided therebetween that is sufficient not to cause inversion in polarity of the output signal of the hysteresis comparator 9. Thus, even when the second single pulses in the induction voltage signals $V_R+$, $V_R-$ of double pulses are inputted to the amplifier 8, the output signal $D_{OUT}$ of the hysteresis comparator 9 is still kept to be in a Low state in a stable manner, without being affected thereby at all and without being affected by noise as well.

As is understood from the above, the edge detection signal $D_{SWB}$ of high level that is outputted for the specified period T2 from the both-edge detection unit 15 when the output signal $D_{OUT}$ of the hysteresis comparator 9 is inverted in level from High to Low at the time t2, is given as a signal with respect to the hysteresis comparator 9 for setting up the insensitive period for the second single pulses in the induction voltage signals $V_R+$, $V_R-$ of double pulses.

Note that in FIG. 17, there are shown the operation waveforms in the case where the input signal $D_{IN}$ is Low at the time of power turn-on or reset operation; however, in the case where the input signal $D_{IN}$ is High at the time of power turn-on or reset operation, the output voltage of the hysteresis comparator 9 is initialized to be High by turning ON the second switch 22 and the third switch 23 using the control signal $D_{CTR}$ of the control circuit 10. Further, in the case where the input signal $D_{IN}$ is High at the time of power turn-on or reset operation, operation waveforms after that time provide basically the same operations as those in the case of FIG. 17 except only that the input signal $D_{IN}$ is being inverted in polarity at the time t1 and the time t2 shown in FIG. 17, so that description of the operation waveforms after the time of power turn-on or reset operation is omitted.

As described above, like the cases of Embodiments 1, 2, the signal transmitting circuit of Embodiment 3 of the invention initializes using the control circuit 10 the output signal $D_{OUT}$ of the hysteresis comparator 9 at the time of power turn-on or reset operation, and when the output signal $D_{OUT}$ logically changes, detects that change in level at the both-edge detection unit 15 to turn OFF the sixth and seventh switches 26, 27 to thereby forcibly disconnect between the output terminals of the amplifier 8 and the input terminals of the hysteresis comparator 9. Thus, in the induction voltage signals $V_R+$, $V_R-$ of double pulses outputted from the receiver coil 3 every time the input signal $D_{IN}$ changes in logical value, the first single pulses are only inputted to the hysteresis comparator 9 after amplified by the amplifier 8. Accordingly, there is no case where a delay corresponding to the period T1 between the first single pulse and the second single pulse occurs between the input signal $D_{IN}$ and the output signal $D_{OUT}$ as in the conventional case, and further, it is possible to surely avoid an influence of the output signals $V_O+$, $V_O-$ from the amplifier 8. Thus, a voltage conversion can be executed smoothly even at the time of performing an inverter control, for example.

Further, at the time of disconnecting between the output terminals of the amplifier 8 and the input terminals of the hysteresis comparator 9 by the edge detection signal $D_{SWB}$ from the both-edge detection unit 15, the fourth and fifth reference potentials VB4, VB5 by which the output signal of the hysteresis comparator 9 is not logically inverted, are applied to the respective input terminals of the hysteresis comparator 9 by the rising-edge detection signal $D_{SWR}$ of the rising-edge detection unit 13 and the falling-edge detection signal $D_{SWF}$ of the falling-edge detection unit 14, so that an erroneous operation due to influence of the offset voltage of the hysteresis comparator 9 can be suppressed. Furthermore, because the potentials of the respective input terminals of the hysteresis comparator 9 are fixed according to the magnitude relationship of the fourth and fifth reference potentials VB4, VB5 by which the output signal of the hysteresis comparator 9 is not logically inverted, it is possible to suppress an erroneous operation due to single-phase noise.

It should be noted that the present invention is not limited only to the configurations of the respective Embodiments 1 to 3, and unlimited combination of the respective Embodiments 1-3, and any kind of modification or any omission in the configurations of Embodiments 1 to 3, may be made within the scope without departing from the spirit of the invention.

The invention claimed is:

1. A signal transmitting circuit that transmits each transmission data through a transmitter coil and a receiver coil, comprising:
   a transmitter circuit that feeds to the transmitter coil, every time the transmission data changes in logical value, a current signal in pulse form having a positive or negative polarity that is alternately inverted in response to each change in logical value, the current signal having a pulse width that is a width required for making an induction voltage induced in the receiver coil in accordance with a change rate of a pulse current into a pair of first single pulses and second single pulses each having a single pulse shape; and
   a receiver circuit that inputs induction voltage signals each being a pair of the first single pulses and the second single pulses having both positive and negative polarities, which have been induced in the receiver coil by the current signal fed to the transmitter coil, to thereby demodulate the transmission data;
   wherein the receiver circuit comprises:
   an amplifier that amplifies the induction voltage signals of the first single pulses and the second single pulses induced in the receiver coil; and
   a signal generating unit that, when detecting the first single pulses in the induction voltage signals of the first single pulses and the second single pulses amplified by the amplifier, sets up in response to that detection, an insensitive period that is longer than the width required for making the current signal of the transmission data into the first single pulses and the second single pulses and during which the second single pulses are prevented from causing a state of an output signal to change, to thereby generate an output signal corresponding to the transmission data, solely on the basis of the first single pulses.

2. The signal transmitting circuit of claim 1, wherein the signal generating unit comprises:
   a hysteresis comparator having a hysteresis characteristic that, when a difference between the induction voltage signals having both polarities amplified by the amplifier exceeds a pre-set threshold value, causes a level inversion and retains an output depending on polarities at that time of the induction voltage signals;
   a reset unit that resets the output of the hysteresis comparator at least at the time of power turn-on;
   an edge detection unit that detects a rising edge and a falling edge of a signal of the output of the hysteresis comparator; and
   a first switch that, when the rising edge and the falling edge of the output signal of the hysteresis comparator are detected by the edge detection unit, turns ON in response to that detection for the insensitive period for the second single pulses, to thereby short-circuit between both plus-side and minus-side input terminals of the hysteresis comparator.

3. The signal transmitting circuit of claim 1, wherein the signal generating unit comprises:
   a hysteresis comparator that, when a difference between the induction voltage signals having both polarities amplified by the amplifier exceeds a pre-set threshold value, causes a level inversion and retains an output depending on polarities at that time of the induction voltage signals;
   a reset unit that resets the output of the hysteresis comparator at least at the time of power turn-on;
   an edge detection unit that detects a rising edge and a falling edge of a signal of the output of the hysteresis comparator;
   an output interruption switch that, when the rising edge and the falling edge of the output signal of the hysteresis comparator are detected by the edge detection unit, turns OFF in response to that detection for the insensitive period for the second single pulses, to thereby interrupt outputs of the amplifier; and
   a third-reference-potential applying switch group that, when the rising edge and the falling edge of the output signal of the hysteresis comparator are detected, turns ON in response to that detection for the insensitive period for the second single pulses, to thereby short-circuit between both plus-side and minus-side input terminals of the hysteresis comparator, and applies a third reference potential to the both plus-side and minus-side input terminals of the hysteresis comparator.

4. The signal transmitting circuit of claim 3, wherein the third reference potential is set to be a potential by which the hysteresis comparator does not operate.

5. The signal transmitting circuit of claim 1, wherein the signal generating unit comprises:
   a hysteresis comparator that, when a difference between the induction voltage signals having both polarities amplified by the amplifier exceeds a pre-set threshold value, causes a level inversion and retains an output depending on polarities at that time of the induction voltage signals;
   a reset unit that resets the output of the hysteresis comparator at least at the time of power turn-on;
   a both-edge detection unit that detects a rising edge and a falling edge of a signal of the output of the hysteresis comparator;
   a rising-edge detection unit that detects the rising edge of the output signal of the hysteresis comparator;
   a falling-edge detection unit that detects the falling edge of the output signal of the hysteresis comparator;
   an output interruption switch that, when the rising edge and the falling edge of the output signal of the hysteresis comparator are detected by the both-edge detection unit, turns OFF in response to that detection for the insensitive period for the second single pulses, to thereby interrupt outputs of the amplifier;
   a fourth-reference-potential applying switch group that, when the rising edge of the output signal of the hysteresis comparator is detected by the rising-edge detection unit or when the falling edge of the output signal of the hysteresis comparator is detected by the falling-edge detection unit, turns ON in response to that detection for the insensitive period for the second single pulses, to thereby apply a fourth reference potential to a plus-side input terminal of the hysteresis comparator; and a fifth-reference-potential applying switch group that, when the rising edge of the output signal of the hysteresis comparator is detected by the rising-edge detection unit or when the falling edge of the output signal of the hysteresis comparator is detected by the falling-edge detection unit, turns ON in response to that detection for the insensitive period the second single pulses, to thereby apply a fifth reference potential to a minus-side input terminal of the hysteresis comparator.

6. The signal transmitting circuit of claim 5, wherein, with respect to the fourth reference potential and the fifth reference potential, the fifth reference potential is lower than the fourth reference potential, and a potential difference between the fourth reference potential and the fifth reference potential is set to be such a potential difference by which the hysteresis comparator does not operate.

7. The signal transmitting circuit of claim 2, wherein the reset unit comprises:
   a second switch whose one-side end is connected to the plus-side input terminal of the hysteresis comparator and whose other-side end is connected to a first reference potential;
   a third switch whose one-side end is connected to the minus-side input terminal of the hysteresis comparator and whose other-side end is connected to a second reference potential; and
   a control circuit that controls ON/OFF of the second switch and the third switch.

8. The signal transmitting circuit of claim 7, wherein, when the logical value of the transmission data to be inputted to the transmitter circuit is Low at the time of power turn-on or reset operation, the reset unit pre-sets so that the second reference potential becomes higher than the first reference potential and the control circuit turns ON both the second switch and the third switch in response to the power turn-on or the reset operation, to thereby bring a potential of an output terminal of the hysteresis comparator to Low.

9. The signal transmitting circuit of claim 7, wherein, when the logical value of the transmission data to be inputted to the transmitter circuit is High at the time of power turn-on or reset operation, the reset unit pre-sets so that the second reference potential becomes lower than the first reference potential and the control circuit turns ON both the second switch and the third switch in response to the power turn-on or the reset operation, to thereby bring a potential of an output terminal of the hysteresis comparator to High.

10. The signal transmitting circuit of claim 3, wherein the reset unit comprises:
    a second switch whose one-side end is connected to the plus-side input terminal of the hysteresis comparator and whose other-side end is connected to a first reference potential;
    a third switch whose one-side end is connected to the minus-side input terminal of the hysteresis comparator and whose other-side end is connected to a second reference potential; and
    a control circuit that controls ON/OFF of the second switch and the third switch.

11. The signal transmitting circuit of claim 10, wherein, when the logical value of the transmission data to be inputted to the transmitter circuit is Low at the time of power turn-on or reset operation, the reset unit pre-sets so that the second reference potential becomes higher than the first reference potential and the control circuit turns ON both the second switch and the third switch in response to the power turn-on or the reset operation, to thereby bring a potential of an output terminal of the hysteresis comparator to Low.

12. The signal transmitting circuit of claim 10, wherein, when the logical value of the transmission data to be inputted to the transmitter circuit is High at the time of power turn-on or reset operation, the reset unit pre-sets so that the second reference potential becomes lower than the first reference potential and the control circuit turns ON both the second switch and the third switch in response to the power turn-on or the reset operation, to thereby bring a potential of an output terminal of the hysteresis comparator to High.

13. The signal transmitting circuit of claim 5, wherein the reset unit comprises:
    a second switch whose one-side end is connected to the plus-side input terminal of the hysteresis comparator and whose other-side end is connected to a first reference potential;
    a third switch whose one-side end is connected to the minus-side input terminal of the hysteresis comparator and whose other-side end is connected to a second reference potential; and
    a control circuit that controls ON/OFF of the second switch and the third switch.

14. The signal transmitting circuit of claim 13, wherein, when the logical value of the transmission data to be inputted to the transmitter circuit is Low at the time of power turn-on or reset operation, the reset unit pre-sets so that the second reference potential becomes higher than the first reference potential and the control circuit turns ON both the second switch and the third switch in response to the power turn-on or the reset operation, to thereby bring a potential of an output terminal of the hysteresis comparator to Low.

15. The signal transmitting circuit of claim 13, wherein, when the logical value of the transmission data to be inputted to the transmitter circuit is High at the time of power turn-on or reset operation, the reset unit pre-sets so that the second reference potential becomes lower than the first reference potential and the control circuit turns ON both the second switch and the third switch in response to the power turn-on or the reset operation, to thereby bring a potential of an output terminal of the hysteresis comparator to High.

* * * * *